United States Patent
Shi et al.

(10) Patent No.: US 11,917,918 B2
(45) Date of Patent: Feb. 27, 2024

(54) FINGERPRINT IDENTIFICATION MODULE, METHOD FOR FORMING FINGERPRINT IDENTIFICATION MODULE, AND ELECTRONIC DEVICE

(71) Applicant: Ningbo Semiconductor International Corporation, Ningbo (CN)

(72) Inventors: Hu Shi, Ningbo (CN); Mengbin Liu, Ningbo (CN); Yanghui Xiang, Ningbo (CN)

(73) Assignee: NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 424 days.

(21) Appl. No.: 17/196,153

(22) Filed: Mar. 9, 2021

(65) Prior Publication Data
US 2021/0193903 A1 Jun. 24, 2021

Related U.S. Application Data

(63) Continuation of application No. PCT/CN2020/098838, filed on Jun. 29, 2020.

(30) Foreign Application Priority Data

Jul. 22, 2019 (CN) .......................... 201910663428.7

(51) Int. Cl.
*H10N 30/30* (2023.01)
*G06V 40/13* (2022.01)
(Continued)

(52) U.S. Cl.
CPC ....... *H10N 30/302* (2023.02); *G06V 40/1306* (2022.01); *H10N 30/05* (2023.02);
(Continued)

(58) Field of Classification Search
CPC .... H10N 30/302; H10N 30/05; H10N 30/072; H10N 30/10516; H10N 30/874;
(Continued)

(56) References Cited

U.S. PATENT DOCUMENTS

| 9,778,039 B2 | 10/2017 | Najafi et al. |
| 2017/0275158 A1 | 9/2017 | Shin et al. |
| 2020/0279088 A1* | 9/2020 | Lundahl ................. H10N 30/01 |

FOREIGN PATENT DOCUMENTS

| CN | 103296992 A | 9/2013 |
| CN | 104944359 A | 9/2015 |

(Continued)

*Primary Examiner* — Abhishek Sarma
(74) *Attorney, Agent, or Firm* — Anova Law Group, PLLC

(57) ABSTRACT

Fingerprint identification modules, methods for forming the fingerprint identification modules and electronic devices are provided. The method may include providing a substrate, containing a signal process circuit formed therein; providing a carrier substrate; forming one or more piezoelectric transducers on the carrier substrate, wherein a piezoelectric transducer of the one or more piezoelectric transducers includes a first electrode, a piezoelectric layer on the first electrode and a second electrode on the piezoelectric layer; forming a permanent bonding layer, containing one or more cavities, on one of the carrier substrate and the substrate; bonding the carrier substrate with the substrate using the permanent bonding layer, wherein the permanent bonding layer is between the one or more piezoelectric transducers and the substrate, and each piezoelectric transducer covers one cavity; and removing the carrier substrate.

9 Claims, 9 Drawing Sheets

(51) Int. Cl.
*H10N 30/05* (2023.01)
*H10N 30/072* (2023.01)
*H10N 30/87* (2023.01)
*H10N 30/00* (2023.01)

(52) U.S. Cl.
CPC ..... *H10N 30/072* (2023.02); *H10N 30/10516* (2023.02); *H10N 30/874* (2023.02)

(58) Field of Classification Search
CPC .... H10N 30/06; H10N 30/073; H10N 30/875; H10N 39/00; H10N 30/01; H10N 30/10513; H10N 30/87; H10N 30/20; G06V 40/1306; B06B 1/0629; B06B 1/0674; B06B 1/06; H01L 23/13; H01L 23/485
See application file for complete search history.

(56) References Cited

FOREIGN PATENT DOCUMENTS

| | | | |
|---|---|---|---|
| CN | 108664913 | A | 10/2018 |
| CN | 109150135 | A | 1/2019 |
| JP | 2007215177 | A | 8/2007 |
| JP | 2008296582 | A | 12/2008 |
| JP | 2012058084 | A | 3/2012 |
| JP | 2018533246 | A | 11/2018 |
| JP | 2019503095 | A | 1/2019 |
| JP | 2019047462 | A | 3/2019 |

* cited by examiner

FINGERPRINT IDENTIFICATION MODULE, METHOD FOR FORMING FINGERPRINT IDENTIFICATION MODULE, AND ELECTRONIC DEVICE

CROSS-REFERENCE TO RELATED APPLICATION

This application claims the priority of PCT Patent Application No. PCT/CN2020/098838, filed on Jun. 29, 2020, which claims priority to Chinese patent application No. 201910663428.7, filed on Jul. 22, 2019, the content of all of which is incorporated by reference in their entirety.

TECHNICAL FIELD

The present disclosure generally relates to the field of semiconductor manufacturing and, more particularly, relates to a fingerprint identification device and a method for fabricating the fingerprint identification module, and an electronic device.

BACKGROUND

The fingerprint identification technology collects the fingerprint images of the human body through the fingerprint imaging module, and then compares with the existing fingerprint imaging information in the fingerprint identification system to realize the identity recognition. Because of the convenience of use and the uniqueness of body fingerprints, the fingerprint identification technology has been widely used in various fields, such as public security bureau, customs security inspection area, building access control systems, and consumer products, such as personal computers, and mobile phones.

Currently, the ultrasonic fingerprint identification technology has become the major fingerprint identification technology because of its advantages, such as oil-proof, waterproof and strong penetrability, stronger environmental adaptability, and applicable to more complex environments.

The identification unit used in the ultrasonic fingerprint identification technology is a piezoelectric transducer. The piezoelectric transducer is mainly composed of a bottom electrode, a top electrode, and a piezoelectric layer disposed between the bottom electrode and the top electrode. Utilizing the inverse piezoelectric effect, as long as a fixed frequency voltage is applied to the bottom electrode and the top electrode on the upper and lower sides of the piezoelectric layer, the piezoelectric layer will vibrate, and an ultrasonic wave is generated. Because the degrees of absorption, penetration and reflection are different when the ultrasonic wave reaches the surfaces of the different material, the difference in acoustic impedance between skin and air or different skin layers can be used to identify the location of the ridges and valleys of the fingerprint.

SUMMARY

The problems solved by the embodiments of the present disclosure are to provide a fingerprint identification module, a method for forming the fingerprint identification module, and an electronic device to improve the accuracy of the fingerprint identification.

One embodiment of the present disclosure provides a fingerprint identification module. The fingerprint identification module a substrate; a signal processing circuit formed in the substrate; a permanent bonding layer bonded to the substrate, the permanent bonding layer containing one or more cavities; and one or more piezoelectric transducers, located on the permanent bonding layer. A piezoelectric transducer of the one or more piezoelectric transducers includes a first electrode, a piezoelectric layer on the first electrode and a second electrode on the piezoelectric layer, and each piezoelectric transducer covers one cavity.

Another embodiment of the present disclosure provides a method for forming a fingerprint identification module. The method may include providing a substrate, containing a signal process circuit formed therein; providing a carrier substrate; forming one or more piezoelectric transducers on the carrier substrate, wherein a piezoelectric transducer of the one or more piezoelectric transducers includes a first electrode, a piezoelectric layer on the first electrode and a second electrode on the piezoelectric layer; forming a permanent bonding layer, containing one or more cavities, on one of the carrier substrate and the substrate; bonding the carrier substrate with the substrate using the permanent bonding layer, wherein the permanent bonding layer is between the one or more piezoelectric transducers and the substrate, and each piezoelectric transducer covers one cavity; and removing the carrier substrate.

Another embodiment of the present disclosure provides an electronic device including the aforementioned fingerprint identification module.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Currently, the performance of the fingerprint identification module needs to be improved. Now combining a manufacturing method of a fingerprint recognition module, the reason why the performance of the fingerprint identification module needs to improve is analyzed.

FIGS. 1-5 illustrate structures corresponding to certain steps of a method for forming a fingerprint identification module.

Figure 1:
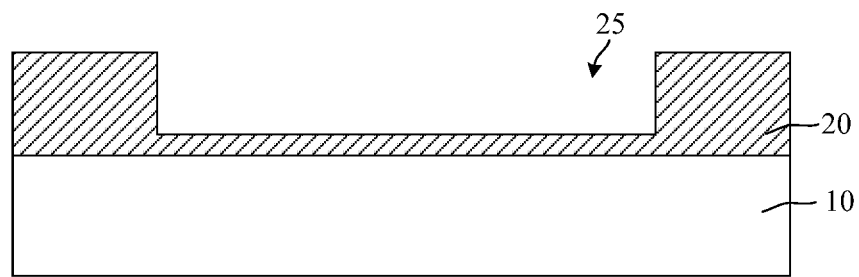
FIGS. 1-5 illustrate structures corresponding to certain stages of a method for forming a fingerprint identification module.

As shown in FIG. 1, the method includes providing a substrate 10, an insulation layer 20 is formed on the substrate 10, and a cavity 25 are formed in the insulation layer 20.

Figure 2:
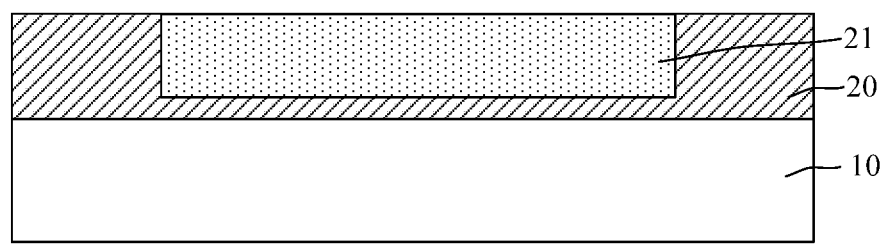

As shown in FIG. 2, the cavity 25 (as shown in FIG. 1) is filled with a sacrificial layer 21.

Figure 3:
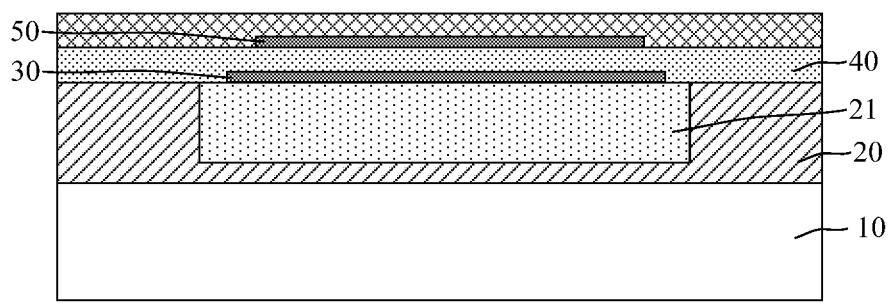

As shown in FIG. 3, a deposition process and a patterning process are sequentially used to form a bottom electrode layer 30 on the sacrificial layer 21. The bottom electrode layer 30 exposes a part of the sacrificial layer 21.

Further, as shown in FIG. 3, a piezoelectric layer 40 covering the insulation layer 20, the sacrificial layer 21 and the bottom electrode layer 30 is formed; a deposition process and a patterning process are used in sequence to form a top electrode layer 50 on the piezoelectric layer 40. The top electrode layer 50, the piezoelectric layer 40 and the bottom electrode layer 30 are used to form a piezoelectric transducer.

Figure 4:
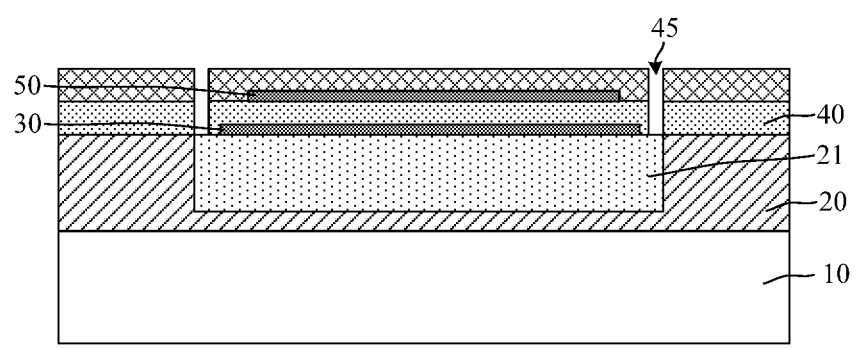

Further, as shown in FIG. 4, a release hole 45 is formed in the piezoelectric layer 40. The release hole 45 is located on the periphery region of the bottom electrode layer 30, and the release hole 45 exposes the sacrificial layer 21.

Figure 5:
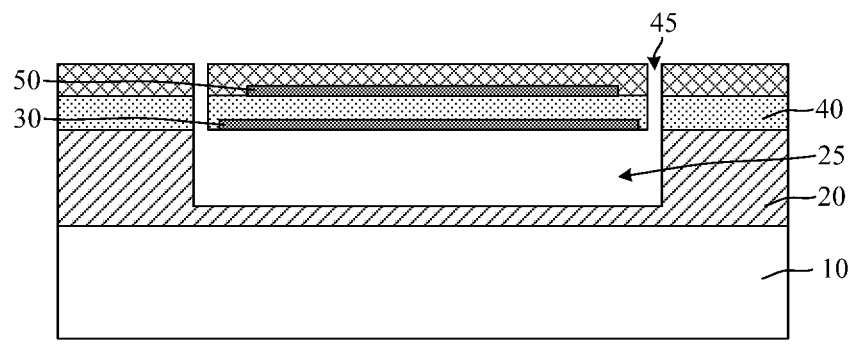

Further, as shown in FIG. 5, the sacrificial layer 21 in the cavity 25 is removed through the release hole 45 (as shown in FIG. 4).

The insulation layer 20 and the bottom electrode layer 30 are both formed on the substrate 10 by deposition processes. The sacrificial layer 21 is used to fill the cavity 25 to provide a process platform for the formation of the bottom electrode layer 30 to facilitate that the semiconductor process is proceeding normally.

However, when the sacrificial layer 21 in the cavity 25 is removed through the release hole 45, it is difficult to ensure that the sacrificial layer 21 can be completely removed. For example, with the development of the miniaturization of the fingerprint identification module, the diameter of the release hole 45 is also getting smaller and smaller, which correspondingly increases the difficulty of removing the sacrificial layer 21. Thus, it may be easy to form sacrificial layer residue in the cavity 25.

On the one hand, because the steps of forming the sacrificial layer 21 and removing the sacrificial layer 21 need to be performed, the process steps are complicated.

On the other hand, during the use of the fingerprint identification module, as long as a fixed frequency voltage is applied between the bottom electrode layer 30 and the top electrode layer 50 on the upper and lower sides of the piezoelectric layer 40, the piezoelectric transducer will vibrate to generate an ultrasonic wave. The ultrasonic wave propagates upwards to the valleys or ridges of the fingerprint. When the ultrasonic wave encounters the surfaces of the ridges, it is partially reflected and partially transmitted. Because the acoustic impedance of the air in the valleys is much higher than that of the ridges, the ultrasonic wave is almost totally reflected when it encounters the valleys. When the ultrasonic wave reflected from the valleys and ridges is transmitted to the piezoelectric transducer, the piezoelectric transducer is deformed, and voltages with different amplitudes, phases or frequencies will be generated at both ends of the piezoelectric layer 40 to achieve the fingerprint information collection. Therefore, if sacrificial layer residues are formed in the cavity 25, the acoustic performance of the cavity 25 is likely to deviate from the design value and fluctuate. Thus, the accuracy of the fingerprint identification is reduced.

To solve the technical problem, the present disclosure provides a method for forming a fingerprint identification module. The method may include providing a substrate with a signal processing circuit formed in the substrate; providing a carrier substrate; and forming piezoelectric transducers on the carrier base. A piezoelectric transducer may include a first electrode, a piezoelectric layer on the first electrode, and a second electrode on the piezoelectric layer. The method may also include forming a permanent bonding layer with cavities on the substrate or the carrier substrate; and bonding the substrate with the carrier substrate using the permanent bonding layer. The permanent bonding layer may be located between the piezoelectric transducers and the substrate, and the piezoelectric transducers may cover the cavities. Further, the method may include removing the carrier substrate.

In one embodiment of the present disclosure, after forming the piezoelectric transducers on the carrier substrate, a permanent bonding layer with cavities may be used to bond the carrier substrate and the substrate, and the permanent bonding layer may be located between the piezoelectric transducers and the substrate. The piezoelectric transducers may cover the cavities. Comparing with the method that the insulation layer with the cavity is formed on the substrate by deposition and patterning, and the piezoelectric transducer is formed on the insulation layer, the present disclosure may use a permanent bonding layer instead of the insulation layer, and piezoelectric transducers may be formed on the carrier substrate. Therefore, in the manufacturing process of the fingerprint identification module, it may not be necessary to form a sacrificial layer to fill the cavities. Accordingly, the subsequent sacrificial layer release operation may not be required; and the problem of sacrificial layer residues being formed in the cavities due to the unclean removal of the sacrificial layer may be avoided. Further, the piezoelectric transducers may cover the cavities to make the cavities have a closed shape, which may be beneficial to improve the acoustic performance improvement effect of the cavities. Thus, the accuracy of the fingerprint identification may be improved.

To make the above-mentioned objectives, features and advantages of the embodiments of the present disclosure more obvious and understandable, the specific embodiments of the present disclosure will be described in detail below in conjunction with the accompanying drawings.

FIGS. 6-19 are schematic structural diagrams corresponding to certain steps of a first exemplary method for forming a fingerprint identification module consistent with various disclosed embodiments of the present disclosure.

Figure 6:
FIGS. 6-19 illustrate structures corresponding to certain stages of a first exemplary method for forming a fingerprint identification module consistent with various disclosed embodiments.

As shown in FIG. 6, a substrate 160 is provided. A signal processing circuit is may be formed in the substrate 160.

The substrate 160 may be used to bond with piezoelectric transducers to form a fingerprint identification module.

The signal processing circuit may be formed in the substrate 160, and the substrate 160 may be used to drive the piezoelectric transducers and process the detection signals generated by the piezoelectric transducers during the use of the fingerprint identification module.

In one embodiment, the substrate 160 is formed based on a CMOS process.

For example, the substrate 560 may be a wafer-level substrate such that the substrate 160 and the piezoelectric transducer can be integrated in a wafer-level manner to improve manufacturing efficiency.

In some embodiments, the substrate may also be a chip-level substrate.

In one embodiment, the signal processing circuit in the substrate 160 may have connection terminals 165. The connection terminals 165 may be used to realize the electrical connections between the substrate 160 and other devices or the piezoelectric transducers.

In one embodiment, the substrate 160 may expose the connection terminals 165. The connection terminals 165 may be pads.

Figure 8:
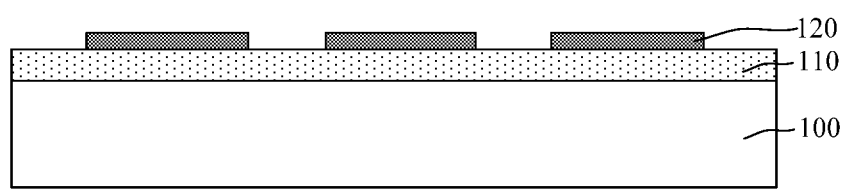
Figure 9:
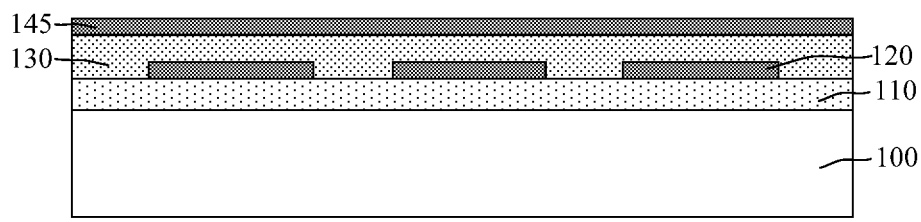
Figure 10:
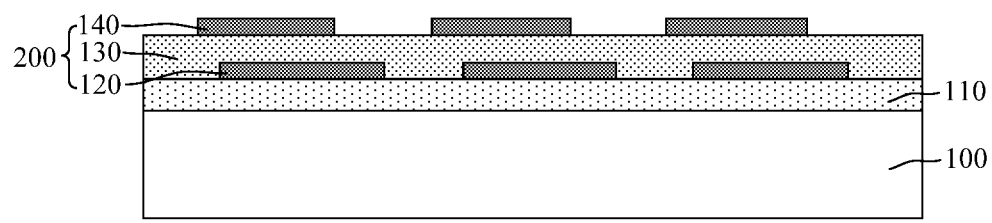

Further, as shown in FIGS. 7-10, a carrier substrate 100 may be provided, and piezoelectric transducers 200 (as shown in FIG. 10) may be formed on the carrier substrate 100. A piezoelectric transducer 200 may include a first electrode 120, a piezoelectric layer 130 on the first electrode 120, and a second electrode 140 on the piezoelectric layer 130.

The carrier substrate 100 may be used to provide a process platform for the formation of the piezoelectric transducers 200.

In one embodiment, the carrier substrate 100 may be a semiconductor wafer.

By selecting a semiconductor wafer, the piezoelectric transducers 200 may be formed by a semiconductor process (for example, a deposition process and a patterning process) such that the adhesion between the layers of the piezoelectric transducers 200 may be significantly to improve the reliability of the piezoelectric transducers 200. Further, the piezoelectric transducers 200 may be formed by a mature semiconductor process, and the process for forming the piezoelectric transducers 200 may be simple, and may have a high process compatibility.

For example, the carrier substrate 100 may be a silicon substrate. Silicon substrate is a commonly used type of substrates in the semiconductor field, with a high process compatibility, and may be easily removed in the subsequent process.

The piezoelectric transducer 200 may serve as an identification unit in a fingerprint identification module.

In one embodiment, the piezoelectric transducers 200 may be formed on the carrier substrate 100 to independently complete the preparation of the piezoelectric transducers 200, which may be beneficial to improve the process flexibility of forming the piezoelectric transducers 200. Further, it may help to avoid the influence of the process of forming the piezoelectric transducers 200 on the substrate 160 to ensure the quality of the substrate 160 Further, it may also be beneficial to reduce the scrap rate of the substrate 160.

In one embodiment, the substrate 160 is a wafer-level substrate, and the number of piezoelectric transducers 200 may be correspondingly multiple. Therefore, the number of the first electrodes 120 may be multiple, the number of the second electrodes 140 may be multiple, and a second electrode 140 may be correspondingly disposed opposite to a first electrode 120.

For example, the process from forming the piezoelectric transducers 200 may include forming a plurality of first electrodes 120 on the carrier substrate 100; forming a piezoelectric layer 130 covering the carrier substrate 100 and the first electrodes 120; and forming a plurality of second electrodes 140 on the piezoelectric layer 130.

By setting the number of the first electrodes 120 and the second electrodes 140 to be multiple, after subsequently bonding the piezoelectric transducers 200 and the substrate 160, there is no need to patterning the first electrodes 120 or the second electrodes 140. Thus, the complexity of subsequent processes may be simplified.

In one embodiment, after forming the piezoelectric transducers 200 on the carrier substrate 100, the first electrodes 120 and the second electrodes 140 may be alternately arranged. For example, the end of any one of the second electrodes 140 may located at one side of the first electrode 120 such that a second conductive plug that is electrically connected to the second electrode 140 may be subsequently formed in the piezoelectric layer 130 at one side of the first electrode 120. Further, when the second conductive plug is formed, it is not necessary to etch the first electrode 120. Thus, the difficulty of the process of forming the second conductive plug may be reduced.

In some embodiments, when the substrate is a chip-level substrate, the number of the piezoelectric transducers may be correspondingly one.

The steps of forming the piezoelectric transducers 200 will be described in detail below with reference to the accompanying drawings.

Figure 7:
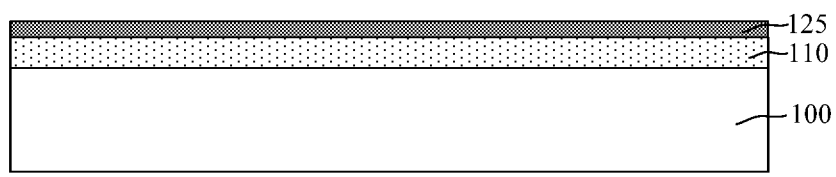

Referring to FIGS. 7-8, a plurality of first electrodes 120 may be formed on the supporting substrate 100 (as shown in FIG. 8).

The material of the first electrodes 120 may be a conductive material, such as metal, metal silicide, metal nitride, metal oxide, or conductive carbon. For example, the material of the first electrodes 120 may be Mo, Al, Cu, Ag, Au, Ni, Co, TiAl, TiN, or TaN, etc. In one embodiment, the material of the first electrode 120 is Mo.

For example, forming the first electrodes 120 may include following steps.

As shown in FIG. 7, a first conductive layer 125 covering the carrier substrate 100 may be formed.

The first conductive layer 125 may be used to prepare for the subsequent formation of the first electrodes.

In one embodiment, the first conductive layer 125 is formed by a deposition process. The deposition process may be an ion sputtering process.

As shown in FIG. 8, the first conductive layer 125 (as shown in FIG. 7) may be patterned to form the first electrodes 120.

The first electrodes 120 may be used as top electrodes of piezoelectric transducers. For example, the top electrodes may refer to the electrodes away from the substrate 160 (as shown in FIG. 6) in the fingerprint identification module.

In one embodiment, a photolithography process including coating photoresist, exposure, and development may be used to form a photoresist mask (not shown), and the first conductive layer 125 may be etched using the photoresist mask as an etching mask to pattern the first conductive layer 125.

In one embodiment, the first conductive layer 125 is etched by a dry etching process. The dry etching process may have anisotropic etching characteristics, which may be beneficial to improve the sidewall topography quality and dimensional accuracy of the first electrodes 120. The dry etching process may be a plasma dry etching process.

After etching the first conductive layer 125, the photoresist mask may be removed by a wet stripping process, or an ashing process.

As shown in FIG. 9, a piezoelectric layer 130 covering the first electrodes 120 and the carrier substrate 100 may be formed.

During the use of the fingerprint identification module, the inverse piezoelectric effect of the piezoelectric layer 130 may be used to generate the ultrasonic wave to realize the ultrasonic fingerprint identification.

The material of the piezoelectric layer 130 may be piezoelectric crystal, piezoelectric ceramic, or piezoelectric polymer. The piezoelectric crystal may be aluminum nitride, lead zirconate titanate, quartz crystal, lithium gallate, lithium germanate, titanium germanate, lithium niobate, or lithium tantalate, etc. The piezoelectric polymer may be polyvinylidene fluoride, vinylidene fluoride-trifluoroethylene copolymer, nylon-11, or vinylidene cyanide-vinyl acetate alternating copolymer, etc.

In one embodiment, the material of the piezoelectric layer 130 is aluminum nitride. Aluminum nitride is a kind of piezoelectric material with very high stability, good inverse piezoelectric effect, and piezoelectric effect. Among them, the inverse piezoelectric effect means that when a voltage is applied across the piezoelectric material, the internal deformation of the piezoelectric material is proportional to the voltage, which is the process of converting electrical energy into mechanical energy. The piezoelectric effect refers to that when the electric material deforms under the action of force, the positive and negative charge centers inside the piezoelectric material are relatively displaced, causing the two ends of the piezoelectric material to generate opposite bonding charges. The amount of charges may be proportional to the stress. The piezoelectric effect may convert the mechanical energy into the electrical energy.

In one embodiment, the piezoelectric layer 130 may be formed by a deposition process. The deposition process may be a reactive sputtering deposition process.

Referring to FIGS. 9 and 10, a plurality of second electrodes 140 may be formed on the piezoelectric layer 130 (as shown in FIG. 10). The plurality of second electrodes 140 may be arranged corresponding to the first electrodes 120.

The second electrodes 140 may be used as bottom electrodes in the piezoelectric transducers. For example, the bottom electrodes may refer to as the electrodes adjacent to the substrate 160 (as shown in FIG. 6) in the fingerprint identification module.

For the specific description of the second electrodes 140, reference may be made to the related description of the first electrodes 120, which will not be repeated here.

For example, the steps of forming the second electrodes 140 may include, as shown in FIG. 9, forming a second conductive layer 145 covering the piezoelectric layer 130 and; as shown in FIG. 10, performing a patterning process on the second conductive layer 145 to form the second electrodes 140.

The second conductive layer 145 may be used to prepare for the subsequent formation of the second electrodes. For the detailed description of the second conductive layer 145 and its forming process, reference may be made to the corresponding description of the first conductive layers 125 mentioned above, which will not be repeated here.

For a specific description of the patterning process, reference may be made to the corresponding description when the first electrodes 120 are formed, which will not be repeated here.

After forming the second electrodes 140, the first electrodes 120, the piezoelectric layer 130, and the second electrodes 140 may be used to form piezoelectric transducers 200.

Referring to FIG. 7, it should be noted that, before forming the piezoelectric transducers 200 (as shown in FIG. 10) on the carrier substrate 100, an isolation layer 110 may be formed on the carrier substrate 100.

After subsequently bonding the piezoelectric transducers 200 and the substrate 160 (as shown in FIG. 6), the carrier substrate 100 may be removed. When the carrier substrate 100 is removed, the surface of the isolation layer 110 facing the surface of the carrier substrate 100 may be used to define the stop position of the removal process of the carrier substrate 100 to ensure the integrity of the piezoelectric transducers 200, and reduce the influence on the bonding strength of the piezoelectric transducers 200 and the substrate 160.

For example, the carrier substrate 100 may be a semiconductor wafer. Therefore, in the subsequent step of thinning the carrier substrate 100 by performing a thinning process on the carrier substrate 100, the isolation layer 110 may be used as a stop layer.

In addition, when the first conductive plugs electrically connected to the first electrodes 120 are subsequently formed, the isolation layer 110 may also be used to provide a process platform for the formation of the first conductive plugs.

Thus, in one embodiment, the material of the isolation layer 110 may be silicon oxide. Silicon oxide is a commonly used dielectric material in the semiconductor field, which may be easy to form and realize patterning, and may have a low process cost. Further, it may better act as a stop layer during the process of thinning the carrier substrate.

In one embodiment, the isolation layer 110 may be formed by a deposition process.

For example, the deposition process may be a chemical vapor deposition process.

Figure 11:
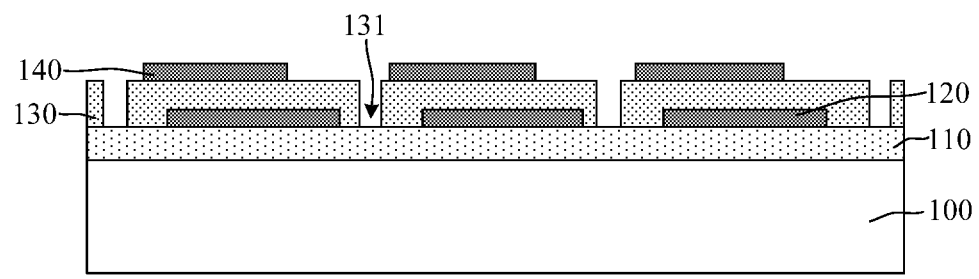
Figure 12:
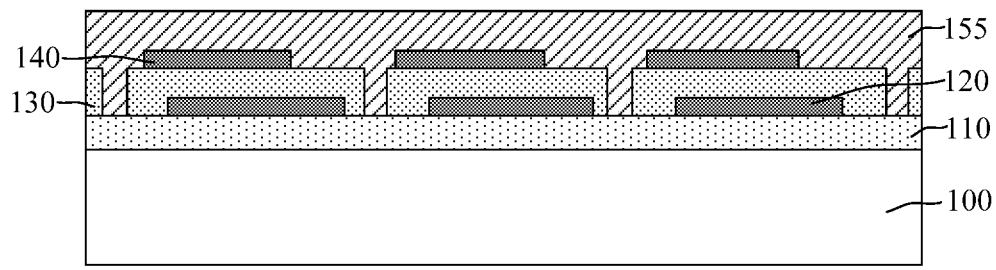
Figure 13:
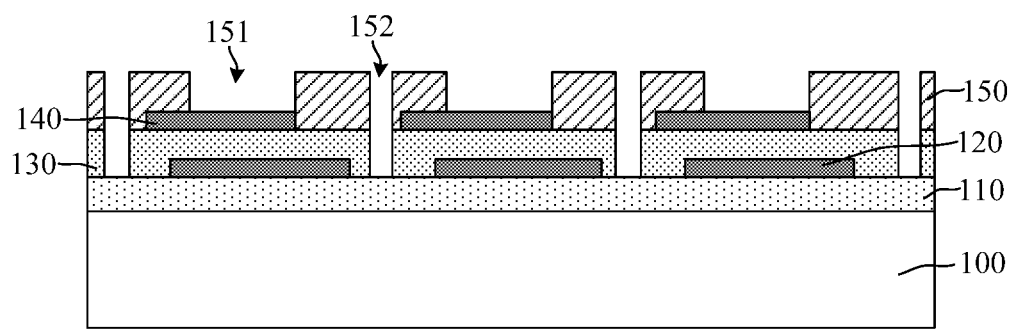

As shown in FIGS. 11-13, a permanent bonding layer 150 having cavities 151 (as shown in FIG. 13) may be formed on the carrier substrate 100. The piezoelectric transducers 200 may cover the cavities 151.

The piezoelectric transducers 200 (as shown in FIG. 10) may be formed on the carrier substrate 100, the permanent bonding layer 150 may be formed on the piezoelectric transducers 200, and the permanent bonding layer 150 may be used to enable the piezoelectric transducers 200 and the substrate 160 (as shown in FIG. 6) to achieve a wafer-level integration.

Moreover, after the permanent bonding layer 150 with the cavities 151 is formed on the carrier substrate 100, the piezoelectric transducers 200 may function to cover the cavities 151. Therefore, after the piezoelectric transducers 200 and the substrate 160 are subsequently bonded, the piezoelectric transducers 200 and the substrate 160 may be able to seal the cavities 151.

The bonding strength of the permanent bonding layer 150 may be relatively high. The permanent bonding layer 150 may be used to achieve a permanent bonding such that the bonding strength of the piezoelectric transducers 200 and the substrate 160 may be guaranteed. Thus, the reliability of the fingerprint identification module may be improved. For example: the fingerprint identification accuracy of the fingerprint identification module may be improved.

Moreover, the process of forming the permanent bonding layer 150 may be completed on the carrier substrate 100, thereby avoiding the process of forming the permanent bonding layer 150 from affecting the substrate 160. Thus, the reliability of the fingerprint identification module may be improved; and the scrap rate of the substrate 160 may be reduced.

In one embodiment, the permanent bonding layer 150 is a dry film, which makes the process of forming the permanent bonding layer 150 simple. Film-like dry film is a kind of adhesive photoresist film used in semiconductor chip packaging or printed circuit board manufacturing. The manufacture of film-like dry film is to coat a solvent-free photoresist on a polyester sheet; and a polyethylene film may be formed to cover the solvent-free photoresist. The polyethylene film may be removed when in use. The solvent-free photoresist may be pressed on the substrate, and after exposure and development, patterns may be formed in the dry film.

For example, the step of forming the permanent bonding layer 150 may include: as shown in FIG. 12, forming a permanent bonding film 155 on the carrier substrate 100 after forming the piezoelectric transducer 200; and, as shown in FIG. 13, patterning the permanent bonding film 155 (as shown in FIG. 12), to form cavities 151 exposing the second electrodes 140. The remaining permanent bonding film 155 may be referred to as the permanent bonding layer 150.

Specifically, the permanent bonding film 155 may cover the piezoelectric layer 130 and the second electrodes 140.

In one embodiment, the permanent bonding film 155 may be formed by a lamination process. The lamination process may be performed in a vacuum environment. By selecting the lamination process, the adhesion and bonding strength of the permanent bonding film 155, the piezoelectric layer 130 and the second electrode 140 may be significantly improved.

In some embodiments, the material selected for the permanent bonding film may also be a liquid dry film. The liquid dry film may refer to that the existence of the components in the film-like dry film may be a liquid form, and accordingly, the permanent bonding film may be formed by a spin-coating process. After forming the permanent bonding film, a step of drying-to-cure process may be performed. Among them, the cured liquid dry film may also be a photosensitive material, which can be patterned through a photolithography process.

In one embodiment, a photolithography process of exposure and development may be used to pattern the permanent bonding film 155 to form the cavities 151. The photolithography process may be beneficial to improve the accuracy of the opening size of the cavities 151.

By improving the dimensional accuracy of the opening of the cavities 151, the acoustic performance of the piezoelectric transducers 200 may be ensured. Moreover, by adopting a photolithography process to achieve patterning, the influence on the bonding strength of the permanent bonding layer 150 may be reduced. In addition, compared with the solution of using an etching process to etch the permanent bonding film to form cavities, damage to the second electrodes 140 may be avoided.

The shape and size of the cavities 151 may be determined according to the design parameters of the piezoelectric transducers 200.

In one embodiment, a portion of the surface of a second electrode 140 may be exposed at the bottom of the cavity 151. In some embodiments, the sidewall surfaces of the cavity and the sidewall surface of the second electrode may flush. In other embodiments, along the direction parallel to the surface of the carrier substrate, the size of the opening of the cavity may be larger than the size of the second electrode. Accordingly, the cavity may not only expose the second electrode, a portion of the piezoelectric layer may also be exposed.

In one embodiment, the substrate 160 may be a wafer-level substrate, and the number of the cavities 151 may be correspondingly multiple, and may correspond to the piezoelectric transducers 200 one-to-one. In other embodiments, when the substrate is a chip-level substrate, the number of cavity may be correspondingly one.

As shown in FIG. 11, after forming the piezoelectric transducers 200 (as shown in FIG. 10) and before forming the permanent bonding layer 150, second sub-conductive holes 131 may be formed in the piezoelectric layer 130.

The signal processing circuit in the substrate 160 (as shown in FIG. 6) may have connection terminals 165 (as shown in FIG. 6). After the piezoelectric transducers 200 are subsequently bonded to the substrate 160, the second sub-conductive holes 131 may be adapted to correspond to the connection terminals 165 to provide a process basis for forming third conductive plugs electrically connected to the connection terminals 165.

In one embodiment, the piezoelectric layer 130 at one side of the first electrodes 120 and the second electrodes 140 may be etched to form the second sub-conductive holes 131 to prevent the first electrodes 120 or the second electrodes 140 from being etched. Thus, the difficulty of etching the piezoelectric layer 130 may be reduced.

At this time, the piezoelectric layer 130 exposed by the second electrodes 140 may not be covered with other films. For example, the process of etching the piezoelectric layer 130 may not be affected by other films. Therefore, by forming the second sub-conductive holes 131, the etching difficulty of forming the piezoelectric layer 130 may be reduced.

In one embodiment, a dry etching process may be used to etch the piezoelectric layer 130.

In some embodiments, after forming the piezoelectric transducers, the piezoelectric layer may not be etched, and the second sub-conductive holes may be formed in a subsequent process.

As shown in FIG. 12, because the second sub-conductive holes 131 may be formed in the piezoelectric layer 130 (as shown in FIG. 11), after the permanent bonding film 155 is formed, the permanent bonding film 155 may also be filled in the second sub-conductive holes 131. The lamination process may be carried out in a vacuum environment. Under the vacuum conditions, the permanent bonding film 155 may also be filled into the second sub-conductive holes 131.

As shown in FIG. 13, in the present disclosure, in the steps of forming the cavities 151, first sub-conductive holes 152 connecting with second conductive holes 131 may be formed in the permanent bonding film 155 (as shown in FIG. 11). The first sub-conductive holes 15 and the second sub-conductive holes 131 may form third conductive holes (not labeled).

Forming the cavities 151 and the first sub-conductive holes 152 in the same step may be beneficial to simplify the process steps. Moreover, the permanent bonding film 155 (as shown in FIG. 12) may not be covered with other film layers, and the process of patterning the permanent bonding film 155 to form the first sub-conductive holes 152 may be relatively simple.

In some embodiments, in the process of forming the permanent bonding layer, only the cavities may be formed, and the first sub-conductive holes may be formed in a subsequent process.

It should be noted that, in other embodiments, after forming the first sub-conductive holes, the piezoelectric layer at the bottom of the first sub-conductive holes may be etched to form a second sub-conductive holes in the piezoelectric layer. Accordingly, third conductive holes passing through the piezoelectric layer and the permanent bonding layer may be formed.

Figure 14:
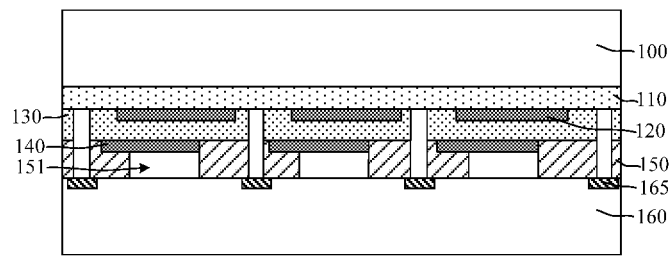

As shown in FIG. 14, the carrier substrate 100 and the substrate 160 may be bonded by the permanent bonding layer 150, and the permanent bonding layer 150 may be located between on the piezoelectric transducers 200 (as shown in FIG. 10) and the substrate 160.

For example, in the bonding step, the surface of the carrier base 100 on which the permanent bonding layer 150 is formed may be disposed opposite to the substrate 160.

The piezoelectric transducers 200 may be formed on the carrier substrate 100, and the permanent bonding layer 150 may be formed on the piezoelectric transducers 200. Therefore, after bonding the carrier substrate 100 and the substrate 160 using the permanent bonding layer 150, the bonding of the piezoelectric transducers 200 and the substrate 160 may be realized accordingly.

The permanent bonding layer 150 may be a viscous material. After the permanent bonding layer 150 disposed on the substrate 160, the piezoelectric transducers 200 may be bonded to the substrate 160. The bonding process may be simple, and the bonding reliability may be high.

In one embodiment, the piezoelectric transducers 200 may cover the cavities 151. Therefore, after the permanent bonding layer 150 is disposed on the substrate 160, the piezoelectric transducers 200 and the substrate 160 may seal the cavities 151. Thus, the cavities 151 may be a sealed status.

The cavities 151 may be used to improve the acoustic performance. Because the piezoelectric transducers 200 and the substrate 160 may seal the cavities 151, the cavities 151 may be isolated from the external environment to maintain the stability of the acoustic performance of the cavities 151. Accordingly, the accuracy of the fingerprint identification may be enhanced.

Moreover, comparing with the solution of sequentially forming an insulation layer with a cavity on the substrate and forming a piezoelectric transducer on the insulation layer by means of deposition and patterning, the present disclosed embodiment may adopt the permanent bonding layer 150 instead of the insulation layer, and the piezoelectric transducers 200 may be formed on the carrier substrate 100. Therefore, the manufacturing method may not need to form a sacrificial layer filling the cavities. Accordingly, there is no need to perform the sacrificial layer release operation later. It may be beneficial to simplify the process steps, and it may also avoid the problem of the formation of sacrificial layer residues in the cavities 151 due to the unclean removal of the sacrificial layer. Thus, the acoustic performance improvement effect of the cavities 151 may be enhanced, and the accuracy of the fingerprint identification may be further increased.

Further, because the present embodiment may not require the steps of forming the sacrificial layer and releasing the sacrificial layer, the problem of the substrate 160 being scrapped due to the sacrificial layer process may be avoided. Thus, the scrap rate of the substrate 160 may be reduced.

Further, the design parameters of the piezoelectric transducers 200 may determine the formation and size of the cavities 151. By controlling the thickness of the permanent bonding layer 150, the longitudinal size of the cavities 151 may be precisely controlled. The cavities 151 may expose the piezoelectric transducers 200 and the substrate 160. Thus, the space of the cavities 151 may be made full use. Accordingly, while ensuring that the longitudinal dimension of the cavities 151 to meet the performance requirements of the piezoelectric transducers 200, requirements of reducing the thickness of the fingerprint identification module may be met.

In one embodiment, in the bonding step, the third conductive holes (not labeled) may correspond to the corresponding connection terminals 165 of the signal processing circuit to expose the connection terminal 165. For example, a first sub-conductive hole 152 may formed in the permanent bonding layer 150 (as shown in FIG. 13). Therefore, after the permanent bonding layer 150 is disposed on the substrate 160, the first sub-conductive hole 152 may correspond to the connection terminal 165.

In one embodiment, the substrate 160 may be a wafer-level substrate, and the numbers of the piezoelectric transducers 200 and the cavities 151 may be both multiple. Therefore, the piezoelectric transducers 200 and the cavities 151 may have a one-to-one correspondence. For example, the second electrodes 140 and the cavities 151 may have a one-to-one correspondence.

In one embodiment, after finishing the bonding process, the carrier substrate 100 may be removed.

The carrier substrate 100 may be removed to provide a process basis for the subsequent electrical connection process.

In one embodiment, the carrier substrate 100 is a semiconductor wafer. Therefore, the carrier substrate 100 may be removed by a thinning process. The thinning process may include, but is not limited to, a chemical mechanical polishing (CMP) process, etc.

For example, the isolation layer 110 may serve as a stop layer for the thinning process. Therefore, after the carrier substrate 100 is removed, the isolation layer 110 may be formed on the surfaces of the first electrodes 120 and the piezoelectric layer 130.

Figure 15:
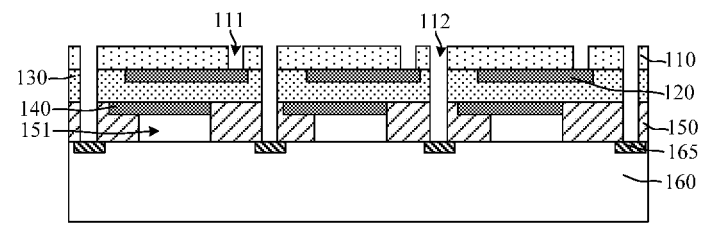

As shown in FIG. 15, after removing the carrier substrate 100 (as shown in FIG. 14), a plurality of first conductive holes 111 exposing the first electrodes 120 may be formed in the isolation layer 110.

The first conductive holes 111 may be used to provide spaces for the subsequent formation of first conductive plugs electrically connected to the first electrodes 120.

In one embodiment, a photolithography process, including photoresist coating, exposure, and development, may be used to form a photoresist mask, and the isolation layer 110 may be etched by using the photoresist mask as an etching mask to form the first conductive holes 111.

In one embodiment, the etching process may be a dry etching process.

It should be noted that, to simplify the process steps, in the process of etching the isolation layer 110, fourth conductive holes 112 connecting with the second sub-conductive holes 131 may be formed in the isolation layer 110 (as shown in FIG. 11).

The fourth conductive holes 112 may connect with the second sub-conductive holes 131, and the second sub-conductive holes 131 may connect with the first sub-conductive holes 152 (as shown in FIG. 13) in the permanent bonding layer 150. The second sub-conductive holes 131, the first sub-conductive holes 152, and the fourth conductive holes 112 may be used to provide spaces for the subsequent formation of third conductive plugs electrically connected to the connection terminals 165.

After etching the isolation layer 110, the photoresist mask may be removed by a wet stripping process, or an ashing process, etc.

It should be noted that in the foregoing process, after the piezoelectric layer 130 is formed, the required second sub-conductive holes 131 may be subsequently formed in the piezoelectric layer 130. In the process of forming the permanent bonding layer 150, the required cavities 151 and the first sub-conductive holes 152 may be formed in the same step. After the carrier substrate 100 is removed, the required first conductive holes 111 and fourth conductive holes 112 may be formed in the same step. For example, after forming a film layer each time, corresponding patterns may be subsequently formed in the film layer. Thus, the process difficulty of the patterning process may be significantly reduced.

Figure 16:
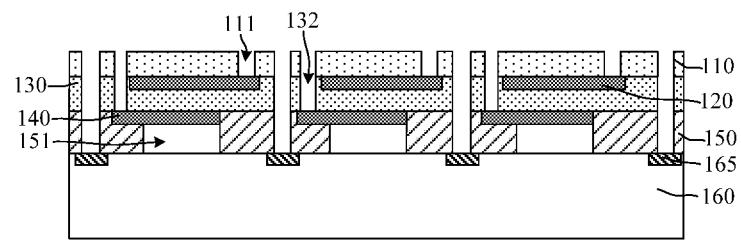

Further, as shown in FIG. 16, the method may further include forming second conductive holes 132 exposing the second electrodes 140 in the isolation layer 110 and the piezoelectric layer 130 at one side of the first electrodes 120.

The second conductive holes 132 may be used to provide spaces for the subsequent formation of second conductive plugs electrically connected to the second electrodes 140.

In one embodiment, a photolithography process, including coating photoresist, exposure, and development, may be used to form a photoresist mask. The isolation layer 110 and the piezoelectric layer 130 may be sequentially etched using the photoresist mask as an etching mask to form the second conductive holes 132.

In the step of forming the photoresist mask, the photoresist mask may also be filled into the first conductive holes 111 and the fourth conductive holes 112 (as shown in FIG. 15) to avoid the damage to the first electrodes 120 and the connection terminals 165 caused by the etching process.

In one embodiment, a dry etching process may be used to sequentially etch the isolation layer 110 and the piezoelectric layer 130 to form the second conductive holes 132.

After forming the second conductive holes 132, the photoresist mask may be removed through a wet stripping process, or an ashing process, etc.

In one embodiment, the first conductive holes 111 and the fourth conductive holes 122 may be formed first, and then the second conductive holes 132 may be formed. In some embodiments, the first conductive holes and the fourth conductive holes may be formed after forming the second conducive holes.

Figure 17:
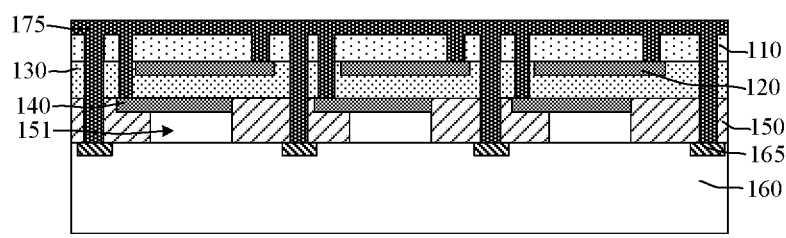
Figure 18:
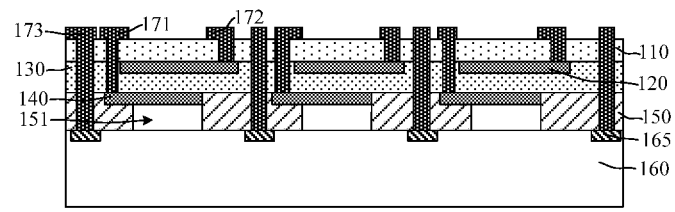

As shown in FIGS. 17-18, after removing the carrier substrate 100 (as shown in FIG. 14), the method may further include forming interconnect structures (not labeled) configured to electrically connect the first electrodes 120, the second electrodes 140, or the corresponding connection terminals 165 of the signal processing circuit.

By electrically connecting the connection terminals 165 with the first electrodes 120 and the second electrodes 140 by the interconnect structures, the substrate 160 and the piezoelectric transducers 200 (as shown in FIG. 10) may be electrically connected. Accordingly, the fingerprint identification function of the fingerprint identification module may be achieved, and the subsequent packaging process may be facilitated.

Moreover, the present embodiment may integrate the integration process of the piezoelectric transducers 200 and the substrate 160 and the electrical connection process of the piezoelectric transducers 200 and the substrate 160 into a same process flow, which may be beneficial to improve the stability of the manufacturing process of the fingerprint identification module. Accordingly, the performance and performance uniformity of the fingerprint identification module may be improved, and the manufacturing cost may be reduced.

For example, the method of forming the interconnection structures may include forming first conductive plugs 172 with the bottoms exposing the edges of the first electrodes 120; forming second conductive plugs 171 with bottoms exposing the edges of the second electrodes 140; and third conductive plugs 173 with bottoms exposing the connection terminals 165.

The first electrodes 120 and the second electrodes 140 may be alternately arranged such that the second conductive plugs 171 may be formed in the piezoelectric layer 130 at the side of the first electrodes 120, and when the second conductive plugs 171 are formed, there may be no need to etch the first electrodes 120. Thus, the difficulty of the process of forming the second conductive plugs 171 may be reduced. Therefore, the bottoms of the first conductive plugs 172 may expose the edge of the first electrodes 120, and the bottoms of the second conductive plugs 171 may expose the edges of the second electrodes 140.

In one embodiment, the first conductive plugs 172 electrically connected to the first electrodes 120 may be formed in the first conductive holes 111 (as shown in FIG. 16), and the second conductive plugs 171 electrically connected to the second electrodes 140 may be formed in the second conductive holes 132 (as shown in FIG. 16). Further, the third conductive plugs 173 electrically connected to the connection terminals 165 may be formed in the fourth conductive holes 112 (shown in FIG. 15) and the third conductive holes (not labeled).

A third conductive hole may include a second sub-conductive hole 131 (as shown in FIG. 11) and a first sub-conductive hole 152 (as shown in FIG. 13) connecting with other.

The first conductive plugs 172 may be used to realize the electrical connections between the first electrodes 120 and external circuits, and the second conductive plugs 171 may be used to realize the electrical connections between the second electrodes 140 and the external circuits. The third conductive plug 173 may be used to realize electrical connections between the substrates 160 and external circuits.

The first conductive plugs 172, the second conductive plugs 171, and the third conductive plug s173 may facilitate the electrical connections between the substrate 160 and the first electrodes 120 and the second electrodes 140.

For example, through a deposition process, the first conductive holes 111, the second conductive holes 132, the fourth conductive holes 112 (as shown in FIG. 15) and the third conductive holes may be filled with a conductive material 175 (as shown in FIG. 17). The conductive material 175 may also cover the isolation layer 110; and the conductive material 175 on the isolation layer 110 may be patterned.

Correspondingly, the first conductive plugs 172, the second conductive plugs 171, and the third conductive plugs 173 may all protrude from the isolation layer 110.

In one embodiment, the conductive material 175 may include one or more of Cu, Au, Ag, and Al, and the deposition process may be an electroplating process.

In one embodiment, a photolithography process including photoresist coating, exposure, and development, may be used to form a photoresist mask. The conductive material 175 may be etched using the photoresist mask as an etching mask to pattern the conductive material 175 into the first conductive plugs 172, the second conductive plugs 171, and the third conductive plugs 173.

After etching the conductive material 175, the photoresist mask may be removed by a wet stripping process, or an ashing process, etc.

In one embodiment, the conductive plug (CT) process may be used to form the interconnect structures, the process complexity of the electrical connection process, and the subsequent packaging process may be facilitated.

Figure 19:
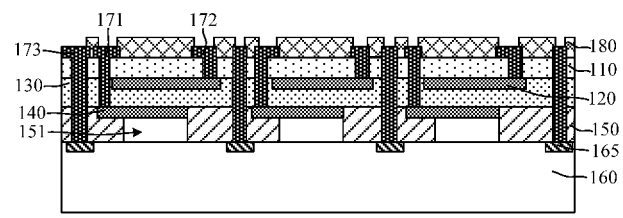

Further, as show in FIG. 19, a passivation layer 180 may be formed on the isolation layer 110 exposed by the first conductive plugs 172, the second conductive plugs 171, and the third conductive plugs 173. The passivation layer 180 may expose the first conductive plugs 172, the second conductive plugs 171 and the third conductive plugs 173.

The passivation layer 180 may be used to protect the piezoelectric transducers 200 (as shown in FIG. 10), and may prevent external impurities (such as sodium ions), ion charges, and water vapor from affecting the piezoelectric transducers 200. Thus, the performance and stability of the fingerprint identification module may be improved; and the accuracy of fingerprint identification of the fingerprint identification module may be enhanced.

In addition, the passivation layer 180 may expose the first conductive plugs 172, the second conductive plugs 171, and the third conductive plugs 173, and the subsequent packaging process may be facilitated.

For example, the steps of forming the passivation layer 180 may include forming a passivation material layer (not shown) on the isolation layer 110, and to cover the first conductive plugs 172, the second conductive plugs 171 and a third conductive plug 173; and etching the passivation material layer to expose the first conductive plugs 172, the second conductive plugs 171 and the third conductive plugs 173. The remaining passivation material layer may be referred to as the passivation layer 180.

The material of the passivation layer 180 may be silicon oxide, silicon nitride, silicon carbon nitride, silicon carbon oxynitride, silicon oxynitride, boron nitride, boron carbon nitride, low-k dielectric material, or polyimide, etc. The low-k dielectric material may refer to a dielectric material with a relative dielectric constant greater than or equal to 2.6 and less than or equal to 3.9.

FIGS. 20-23 are schematic diagrams of the structures corresponding to certain steps in the second embodiment of a fabrication method of a fingerprint identification module consistent with various disclosed embodiments of the present disclosure.

Figure 20:
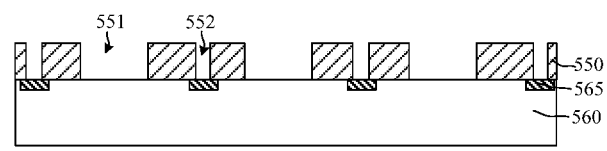
FIGS. 20-23 illustrate structures corresponding to certain stages of a second exemplary method for forming a fingerprint identification module consistent with various disclosed embodiments.

The similarities between this embodiment and the first embodiment will not be repeated here. The difference between this embodiment and the first embodiment is that, as shown in FIG. 20, a permanent bonding layer 550 having cavities 551 may be formed on a substrate 560.

In one embodiment, a signal processing circuit may be formed in the substrate 560, the signal processing circuit may have connection terminals 565, and the substrate 560 may expose the connection terminals 565. The connection terminals 565 may be used to realize the electrical connections between the substrate 560 and external circuits (such as piezoelectric transducers).

For the specific description of the substrate 560, reference may be made to the corresponding description in the first embodiment, which will not be repeated here.

In one embodiment, the permanent bonding layer 550 may be a dry film.

For example, the steps of forming the permanent bonding layer 550 may include forming a permanent bonding film (not shown) on the substrate 560; patterning the permanent bonding film to form cavities 551 in in the permanent bonding film. The remaining permanent bonding film may be referred to as the permanent bonding layer 550.

In one embodiment, the permanent bonding film may be formed by a lamination process, and the permanent bonding film may be patterned by the exposure and development process.

In one embodiment, in the step of patterning the permanent bonding film, first sub-conductive holes 552 may also be formed in the permanent bonding film, and the first sub-conductive holes 552 may expose the corresponding connection terminals 565 of the signal processing circuit. In other words, the permanent bonding layer 550 may have the cavities 551 and first sub-conductive holes 552 exposing the connection terminals 565.

For the specific description of the permanent bonding layer 550, the cavities 551, the first sub-conductive holes 552 and the formation method thereof, reference may be made to the corresponding description in the first embodiment, which will not be repeated here.

Figure 21:
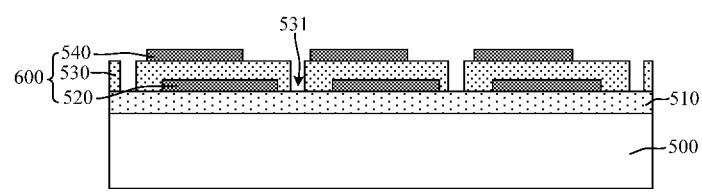

As shown in FIG. 21, a carrier substrate 500 may be provided, and piezoelectric transducers 600 may be formed on the carrier substrate 500. A piezoelectric transducer 600 may include a first electrode 520, a piezoelectric layer 530 on the first electrode 520, and a second electrode 540 on the piezoelectric layer 530.

In one embodiment, the carrier substrate 500 may be a semiconductor wafer. For example, the carrier substrate 100 may be a silicon substrate.

In one embodiment, the piezoelectric transducers 600 may be formed by a semiconductor process (for example, a deposition process, and a patterning process, etc.).

For the specific description of the piezoelectric transducers 600 and their forming method, references may be made to the corresponding description in the first embodiment, which will not be repeated here.

It should be noted that, before forming the piezoelectric transducers 600 on the carrier substrate 500, the method may further include forming an isolation layer 510 on the carrier substrate 500. In the subsequent step of thinning the carrier substrate 500, the isolation layer 510 may be used as a stop layer. In one embodiment, the material of the isolation layer 510 may be silicon oxide.

It should be noted that, after forming the piezoelectric transducer 600, the method may further include forming second sub-conductive holes 531 in the piezoelectric layer 530.

For the specific description of the second sub-conductive holes 531 and their forming method, reference may be made to the corresponding description in the first embodiment, which will not be repeated here.

Figure 22:
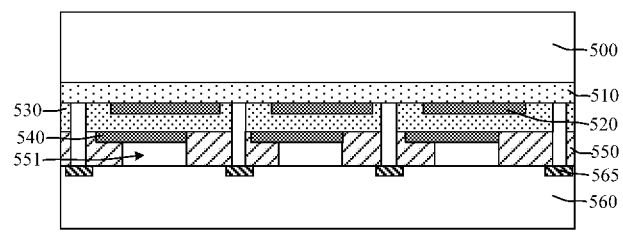

As shown in FIG. 22, the carrier substrate 500 and the substrate 560 may be bonded using the permanent bonding layer 550. The permanent bonding layer 550 may be located between the piezoelectric transducer 600 (as shown in FIG. 21) and the substrate 560. The piezoelectric transducer 600 may cover the cavity 551.

For example, in the bonding step, the cavities 551 and the second electrodes 540 on the carrier substrate 500 may be arranged opposite to each other.

The permanent bonding layer 550 may be a viscous material. After the piezoelectric transducers 600 are disposed on the permanent bonding layer 150, the piezoelectric transducers 600 may be bonded to the substrate 560. The bonding process may be simple, and the bonding reliability may be high.

In one embodiment, in the bonding step, the second sub-conductive holes 531 (as shown in FIG. 21) and the first sub-conductive holes 552 (as shown in FIG. 20) may be arranged opposite to each other in one-on-one correspondence to form third conductive holes (not labeled).

As an example, along the direction parallel to the surface of the substrate 560, the lateral size of the second electrode 540 may be larger than the opening size of the cavity 551. Because the permanent bonding layer 550 may have a certain degree of flexibility, under the action of pressure, it may be easy to embed the second electrode 540 in the permanent bonding layer 550 such that the permanent bonding layer 550 and the piezoelectric layer 530 may be in contact. Accordingly, the piezoelectric transducers 600 may play the function of covering the cavities 551.

In some embodiments, when the lateral size of the second electrode is less than or equal to the opening size of the cavity, the piezoelectric transducer may be disposed on the permanent bonding layer to make the permanent bonding layer in contact with the piezoelectric layer. Correspondingly, the piezoelectric transducer may also cover the cavity.

In one embodiment, after the bonding process, the method may further include removing the carrier substrate 500.

For example, the carrier substrate 500 may be removed by performing a thinning process on the carrier substrate 500 to expose the isolation layer 510.

Figure 23:
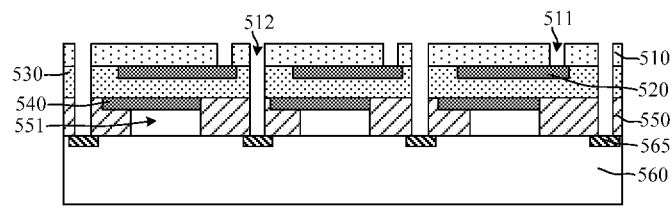

Further, as shown in FIG. 23, after removing the carrier substrate 500 (as shown in FIG. 22), the method may further include etching the isolation layer 510 to form first conductive holes 511 exposing a plurality of the first electrodes 520 in the isolation layer 510.

The first conductive holes 511 may be used to provide spaces for subsequent formation of first conductive plugs electrically connected to the first electrodes 520.

In one embodiment, in the process of etching the isolation layer 510, fourth conductive holes 512 that connect with the second sub-conductive holes 531 (as shown in FIG. 21) may also be formed in the isolation layer 510.

The fourth conductive holes 512 may connect with the second sub-conductive holes 531, and the second sub-conductive holes 531 may connect with the first sub-conductive holes 552 (as shown in FIG. 20) in the permanent bonding layer 550. The fourth conductive holes 512, the second sub-conductive holes 531, and the first sub-conductive holes 552 may be used to provide spaces for the subsequent formation of third conductive plugs electrically connected to the connecting terminals 565.

The subsequent process is the same as that of the first embodiment. For the specific description of the subsequent processes, reference may be made to the corresponding description in the first embodiment, which will not be repeated here.

It should be noted that for the specific description of the forming method in this embodiment, reference may be made to the corresponding description in the first embodiment.

It should also be noted that, in one embodiment, the permanent bonding layer 550 may be formed on the substrate 560 as an example. In some embodiments, the permanent bonding layer may also be formed on a carrier wafer with a temporary bonding film formed on the surface. Correspondingly, after the permanent bonding layer may be used to bond the carrier substrate and the carrier wafer, the permanent bonding layer may be located between the piezoelectric transducers and the carrier wafer. Subsequently, the temporary bonding layer and the temporary bonding film may be separated by de-bonding. Thus, the carrier substrate and the substrate may be bonded by the permanent bonding layer.

FIGS. 24-35 are schematic diagrams of the structures corresponding to certain steps of a third exemplary embodiment of a method for forming a fingerprint identification module consistent with the present disclosure.

Figure 26:
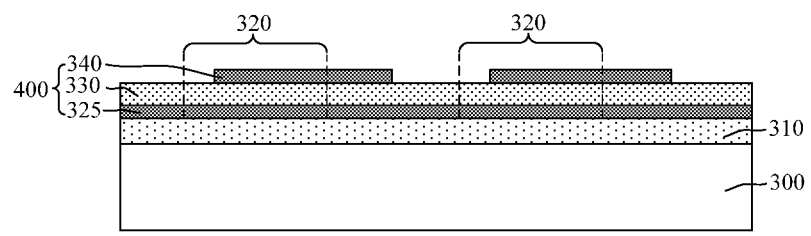
Figure 28:
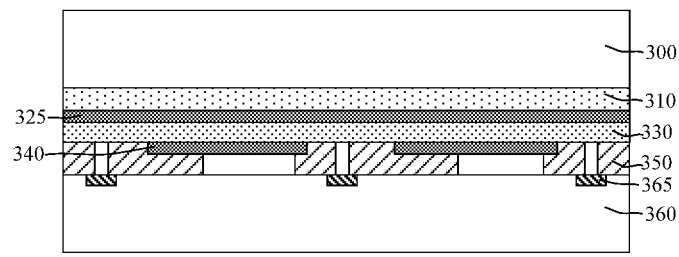
Figure 31:
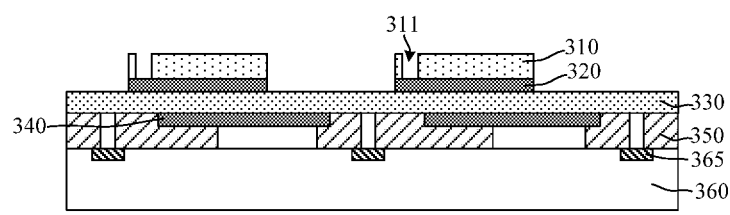

The similarities between such an embodiment and the first embodiment will not be repeated here. The difference between such an embodiment and the first embodiment is: as shown in FIG. 26, the steps of forming the piezoelectric transducers 400 on the carrier substrate 300 may include forming a whole conductive layer 325 covering the carrier substrate 300. Portions of the conductive layer 325 may be used as the first electrodes 320. Correspondingly, as shown in FIG. 31, after removing the carrier substrate 300 (as shown in FIG. 28), the method may further include patterning the conductive layer 325 to form a plurality of first electrodes 320.

Figure 24:
FIGS. 24-35 illustrate structures corresponding to certain stages of a third exemplary method for forming a fingerprint identification module consistent with various disclosed embodiments.

As shown in FIG. 24, a substrate 360 may be provided.

In one embodiment, a signal processing circuit may be formed in the substrate 360. The signal processing circuit may include connection terminals 365, and the substrate 360 may expose the connection terminals 365. The connection terminals 365 may be used to implement electrical connections between the substrate 360 and external circuits (for example: piezoelectric transducers).

For a specific description of the substrate 360, reference may be made to the corresponding description in the first embodiment, which will not be repeated here.

Figure 25:
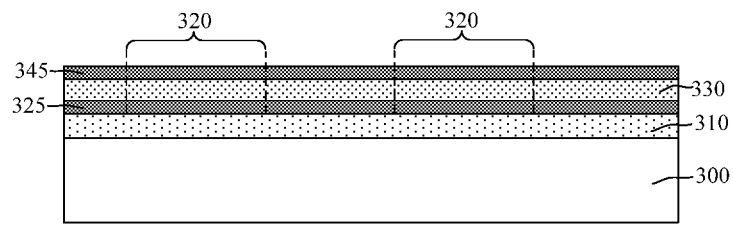

As shown in FIG. 25, a carrier substrate 300 may be provided, and a whole conductive layer 325 covering the carrier substrate 300 may be formed. Portions of the conductive layer 325 may be used as first electrodes 320.

The carrier substrate 300 may be used to provide a process platform for the subsequent formation of the piezoelectric transducers and may also be used to provide a process platform for the subsequent bonding of the piezoelectric transducers and the substrate 360 (as shown in FIG. 24).

In one embodiment, the carrier substrate 300 is a semiconductor wafer. For example, the carrier substrate 300 may be a silicon substrate.

Further, as shown in FIGS. 25-26, a piezoelectric layer 330 covering the first electrodes 320 may be formed, and a plurality of second electrodes 340 may be formed on the piezoelectric layer 330 (as shown in FIG. 26).

For example, the steps of forming the second electrodes 340 may include forming an electrode material layer 345 covering the piezoelectric layer 330 (as shown in FIG. 25); and patterning the electrode material layer 345 to form the second electrodes 340.

After forming the second electrodes 340, the first electrodes 320, the piezoelectric layer 330 and the second electrodes 340 may be used to form the piezoelectric transducers 400.

Further, after forming the piezoelectric transducers 400, the carrier substrate 300 may be covered with a whole conductive layer 325, only the number of the second electrodes 340 is multiple. Such a configuration may be easy to realize the alignment and improve the alignment accuracy in subsequent bonding processes and photolithography processes. Accordingly, the performance of the fingerprint recognition module may be improved.

For the specific description of the piezoelectric transducers 400 and their forming steps, reference may be made to the corresponding description in the first embodiment, which will not be repeated here.

Further, it should be noted that, as shown in FIG. 25, before forming the piezoelectric transducers 400 on the carrier substrate 300 (as shown in FIG. 26), the method may further include forming an isolation layer 310 on the carrier substrate 300.

In the subsequent step of thinning the carrier substrate 300, the isolation layer 310 may be used as a stop layer. In addition, when the first conductive plugs electrically connected to the first electrodes are subsequently formed, the isolation layer 310 may also be used to provide a process platform for the formation of the first conductive plugs.

In one embodiment, the material of the isolation layer 310 may be silicon oxide.

Figure 27:
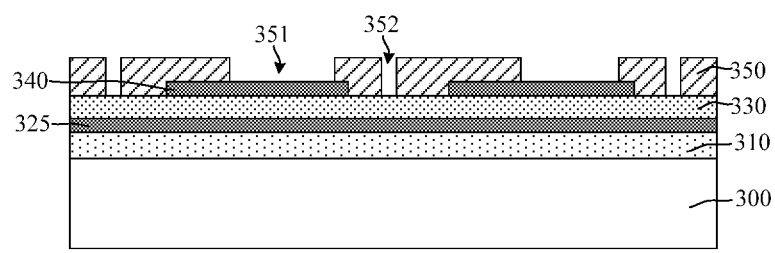

Further, as shown in FIG. 27, a permanent bonding layer 350 having cavities 351 may be formed on the carrier substrate 300, and the piezoelectric transducers 400 (as shown in FIG. 26) cover the cavities 351.

In one embodiment, in the step of forming the permanent bonding layer 350, a plurality of first sub-conductive holes 352 may also be formed in the permanent bonding layer 350.

For the specific description of the permanent bonding layer 350, the cavities 351, the first sub-conductive holes 352 and the forming method thereof, reference may be made to the corresponding description in the first embodiment, which will not be repeated here.

Further as shown in FIG. 28, the carrier substrate 300 and the substrate 360 may be bonded by the permanent bonding layer 350. The permanent bonding layer 350 may be located between the piezoelectric transducers 400 (as shown in FIG. 26) and the substrate 360.

For example, in the bonding step, the surface of the carrier base 300 on which the permanent bonding layer 350 is formed may be opposed to the substrate 360, and the first sub-conductive holes 352 (as shown in FIG. 27) may correspond to the connection terminals 365.

After the piezoelectric transducers 400 are bonded to the substrate 360, the substrate 360 may be used to provide a process platform for the subsequent process of patterning the conductive layer 325.

For the specific description of the bonding step, reference may be made to the corresponding description in the first embodiment, which will not be repeated here.

Figure 29:
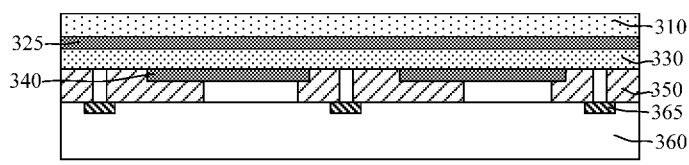

Further, as shown in FIG. 29, after the bonding process is completed, the method may further include removing the carrier substrate 300.

The carrier substrate 300 may be removed to provide a process basis for the subsequent electrical connection process.

In one embodiment, the isolation layer 310 may be used as a stop layer, and the carrier substrate 300 may be thinned.

Figure 30:
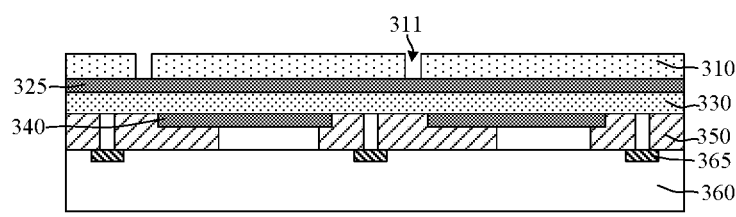

Further, as shown in FIG. 30, after removing the carrier substrate 300 (as shown in FIG. 28), the method may further include forming a plurality of first conductive holes 311 that expose the first electrodes 320 in the isolation layer 310 (as shown in FIG. 26).

Portions of the conductive layer 325 may be used as the first electrodes 320, and the subsequent steps may further include patterning the conductive layer 325, and keeping the first electrode 320. The first conductive holes 311 exposing the first electrodes 320. The first conductive holes 311 may be used to provide spaces for the subsequent formation of first conductive plugs electrically connected to the first electrodes 320.

In one embodiment, a photolithography process, including photoresist coating, exposure, and development, may be used to form a photoresist mask. The isolation layer 310 may be etched using the photoresist mask as an etching mask to form the first conductive holes 311. In one embodiment, the etching process is a dry etching process.

After etching the isolation layer 310 the photoresist mask may be removed by a wet glue-stripping process, or an ashing process, etc.

Further, as shown in FIG. 31, after removing the carrier substrate 300 (as shown in FIG. 28), the method may further includes patterning the conductive layer 325 (as shown in FIG. 30) to form a plurality of first electrodes 320, and make the first conductive holes 311 correspond to the first electrodes 320.

For example, the number of the first electrodes 320 may be multiple, and may be arranged opposite to the second electrodes 340, respectively.

After patterning the conductive layer 325, the first electrodes 320 may expose portions of the piezoelectric layer 330 to prepare for the subsequent etching of the piezoelectric layer 330.

In one embodiment, a dry etching process may be used to pattern the conductive layer 325.

It should be noted that an isolation layer 310 may be formed on the surface of the conductive layer 325. Therefore, the step of patterning the conductive layer 325 may further include patterning the isolation layer 310 such that the first conductive holes 311 may be connected to the first electrodes 311 in a one-on-one correspondence. Correspondingly, after the conductive layer 325 is patterned, only the isolation layer 310 on the surface of the first electrodes 320 may be remained.

In one embodiment, a photolithography process, including coating photoresist, exposure, and development, may be used to form a photoresist mask. The isolation layer 310 and the conductive layer 325 may be etched sequentially using the photoresist mask as an etching mask until the piezoelectric layer 330 is exposed.

It should be noted that before the etching process, first conductive holes 311 may be formed in the isolation layer 310. Therefore, the photoresist mask may be filled in the first conductive hole 311 to prevent the first electrodes 320 exposed by the first conductive holes 311 from being etched.

After the isolation layer 310 and the conductive layer 325 are etched, the photoresist mask may be removed by a wet stripping process, or an ashing process.

Figure 32:
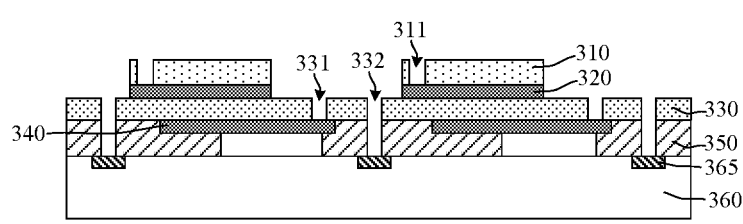

Further, as shown in FIG. 32, after patterning the conductive layer 325 (as shown in FIG. 30), the method may further include forming second conductive holes 331 exposing the second electrodes 340 and second sub-conductive holes 332 connecting with the first sub-conductive holes 352 in the piezoelectric layer 330 (as shown in FIG. 27).

The second conductive holes 331 may be used to provide spaces for the subsequent formation of second conductive plugs electrically connected to the second electrodes 340.

The second sub-conductive holes 332 and the first sub-conductive holes 352 may connect with each other. The second sub-conductive holes 332 and the first sub-conductive holes 352 may provide spatial spaces for subsequently forms third conductive plugs that are electrically connected to the connection terminals 365.

In one embodiment, a photolithography process including coating photoresist, exposure, and development may be used to form a photoresist mask. The piezoelectric layer 330 may be etched using the photoresist mask as an etching mask to form the second conductive holes 331 and the second sub-conductive holes 332.

The first conductive holes 311 exposing the first electrodes 320 may be formed in the remaining isolation layer 310. Therefore, after the photoresist mask is formed, the photoresist mask may not only cover the isolation layer 310, but also be filled in the first conductive holes 311 to prevent the first electrodes 320 from being damaged.

In one embodiment, a dry etching process may be used to etch the piezoelectric layer 330 to form the second conductive holes 331 and the second sub-conductive holes 332.

After the piezoelectric layer 330 is etched, the photoresist mask may be removed by a wet stripping, or an ashing process, etc.

It should be noted that after the conductive layer 325 (as shown in FIG. 20) is patterned, the first electrodes 320 may expose the piezoelectric layer 330. Thus, in the step of forming the second conductive holes 331 and the second sub-conductive hole 332, only the piezoelectric layer 330 may need to be etched, and the etching process may be simple.

It should also be noted that, as shown in FIG. 26, in the step of forming the piezoelectric transducers 400 on the carrier substrate 300, the whole conductive layer 325 covering the carrier substrate 300 may be formed, and the portions of the conductive layer 325 may be used as the first electrodes 320. In this step, the conductive layer 325 may not be patterned. As shown in FIG. 31, after the isolation layer 310 and the conductive layer 325 (as shown in FIG. 30) are patterned, the first electrodes 320 may expose the piezoelectric layer 330. Therefore, the second conductive holes 331 and the second sub-conductive holes 332 may be formed in the same step. Such a process may be beneficial to reduce the number of the photomasks, and the manufacturing cost may be reduced.

Figure 33:
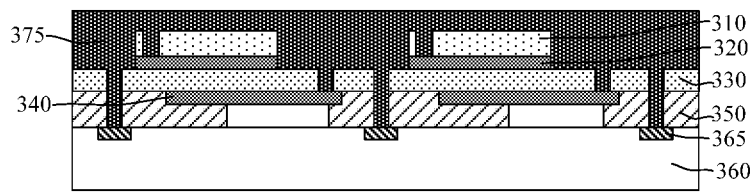
Figure 34:
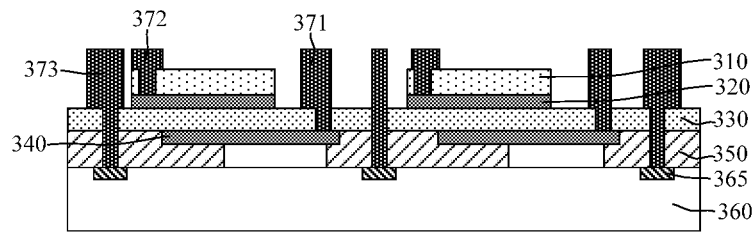

As shown in FIGS. 33 and 34, first conductive plugs 372 electrically connected to the first electrodes 320 may be formed in the first conductive holes 311 (as shown in FIG. 32), and second conductive plugs 371 electrically connected to the second electrodes 340 may be formed in the second conductive holes 331 (as shown in FIG. 32). Third conductive plugs 373 electrically connected to the connection terminals 365 may be formed in the second sub-conductive holes 332 (as shown in FIG. 32) and the first sub-conductive holes 352 (as shown in FIG. 27).

For example, as shown in FIG. 33, a conductive material 375 may be filled in the first conductive holes 311, the second conductive holes 331, the second sub-conductive holes 332 and the first sub-conductive hole 352 by a deposition process. The conductive material 375 may also cover the isolation layer 310. As shown in FIG. 34, the conductive material 375 on the isolation layer 310 may be patterned to form first conductive plugs 372 protruding from the isolation layer 310 and electrically connected to the first electrodes 320, second conductive plugs 371 protruding from the piezoelectric layer 330 and electrically connected to the second electrodes 340, and third conductive plugs 373 protruding from the piezoelectric layer 330 and electrically connected to the connection terminals 365.

For the specific description of the first conductive plugs 372, the second conductive plugs 371, the third conductive plugs 373 and the forming method thereof, reference may be made to the corresponding description in the first embodiment, which will not be repeated here.

Figure 35:
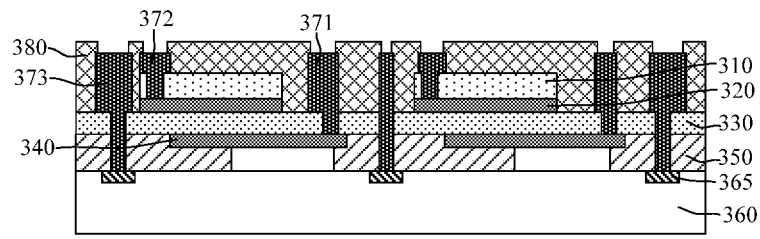

Further, as shown in FIG. 35, a passivation layer 380 may be formed on the piezoelectric layer 330 and the isolation layer 310 exposed by the first conductive plugs 372, the second conductive plugs 371 and the third conductive plugs 373. The passivation layer 380 may expose the first conductive plugs 372, the second conductive plugs 371, and the third conductive plugs 373.

In one embodiment, the passivation layer 380 may be formed by sequentially performing a deposition step and an etching step.

For the specific description of the passivation layer 380 and its forming method, reference may be made to the corresponding description in the first embodiment, which will not be repeated here.

It should be noted that for the specific description of the forming method in this embodiment, reference may be made to the corresponding description in the first embodiment.

Figure 36:
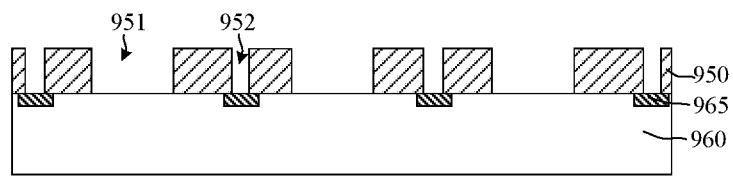
FIGS. 36-38 illustrate structures corresponding to certain stages of a fourth exemplary method for forming a fingerprint identification module consistent with various disclosed embodiments.
Figure 37:
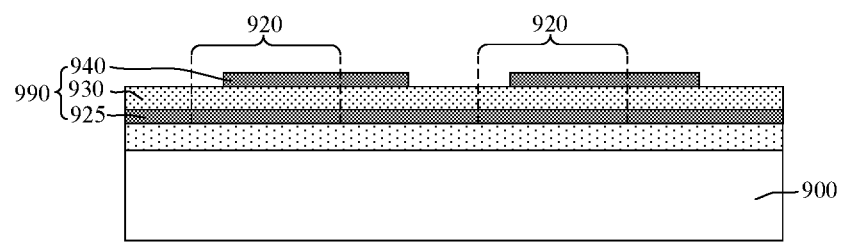
Figure 38:
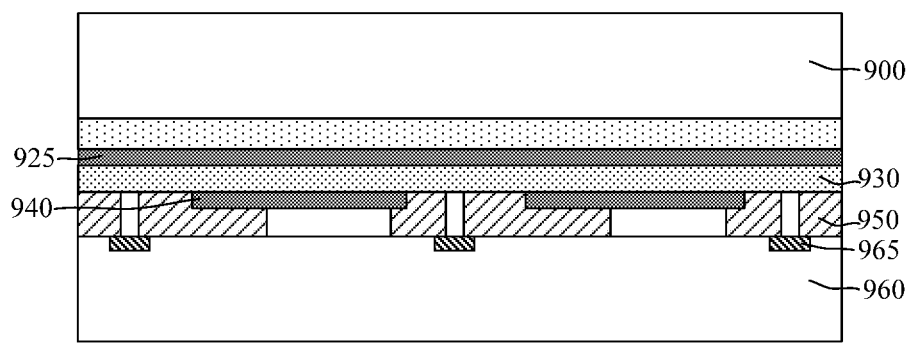

FIGS. 36-38 are schematic diagrams of the structures corresponding to certain steps in the fourth exemplary embodiment of a method of forming the fingerprint identification module consistent with various disclosed embodiments of the present disclosure.

The similarities between this embodiment and the third embodiment will not be repeated here. The difference between this embodiment and the third embodiment may include, referring to FIG. 36, a permanent bonding layer 950 having cavities 951 may be formed on a substrate 960.

In one embodiment, a signal processing circuit may be formed in the substrate 960, and the signal processing circuit may have connection terminals 565. In the step of forming the permanent bonding layer 950 on the substrate 960, the permanent bonding layer 950 may also have first sub-conductive holes 952 exposing the connecting terminals 565.

As shown in FIG. 37, piezoelectric transducers 900 may be formed on the carrier substrate 900.

For example, the step of forming the piezoelectric transducers 900 may include forming a whole conductive layer 925 covering the carrier substrate 900 with portions of the conductive layer 925 being used as first electrodes 920. The number of the first electrodes 920 may be multiple. Further, a piezoelectric layer 930 covering the conductive layer 925 may be formed; and a plurality of second electrodes 940 may be formed on the piezoelectric layer 930. The second electrodes 940 may be disposed to be opposite to the first electrodes 920.

For the specific description of the piezoelectric transducers 900 and their forming method, reference may be made to the corresponding description in the third embodiment, which will not be repeated here.

Further, as shown in FIG. 38, the carrier substrate 900 and the substrate 960 may be bonded by the permanent bonding layer 950, and the permanent bonding layer 950 may be located between the piezoelectric transducers 990 (as shown in FIG. 37) and the substrates 960, and the second electrodes 940 may cover the cavities 951 (as shown in FIG. 36).

In one embodiment, in the step of bonding, the cavities 951 may be disposed opposite to the second electrodes 940 on the carrier substrate 900.

The subsequent process may be same as that of the third embodiment. For the specific description of the subsequent process, reference may be made to the corresponding description in the third embodiment, which will not be repeated here.

For example, for the specific description of the fabrication method in this embodiment, reference may be made to the corresponding descriptions in the first embodiment and the third embodiment in combination.

Correspondingly, the present disclosure also provides a fingerprint identification module.

Figure 39:
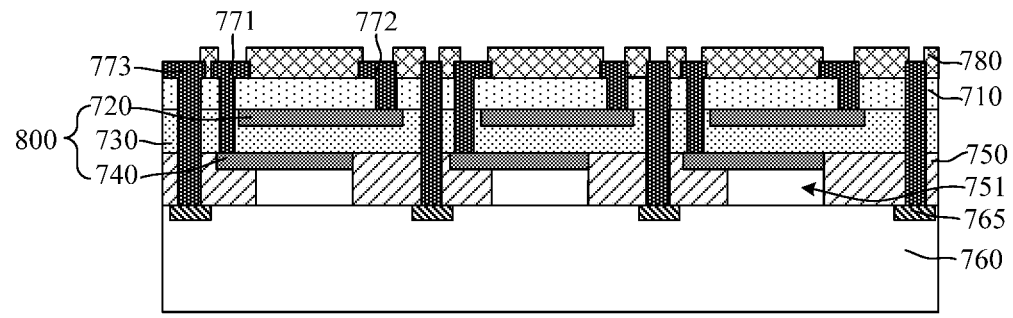
FIG. 39 illustrates an exemplary fingerprint identification module consistent with various disclosed embodiments of the present disclosure.

FIG. 39 illustrates an exemplary fingerprint identification module consistent with various disclosed embodiments of the present disclosure.

The fingerprint identification module may include a substrate 760 in which a signal processing circuit is formed; a permanent bonding layer 750 with cavities 751 bonded to the substrate 760; and piezoelectric transducers 800 located on the permanent bonding layer 750. Each piezoelectric transducer 800 may include a first electrode 720, a piezoelectric layer 730 formed on the first electrode 720, and a second electrode 740 located on the piezoelectric layer 730. The piezoelectric transducers 800 may cover the cavities 751.

Comparing with the solution of forming an insulation layer with a cavity on the substrate by deposition and patterning, and forming a piezoelectric transducer on the insulation layer, the embodiment in the present disclosure may use a permanent bonding layer 750 instead of the insulation layer. In addition, the piezoelectric transducers 800 and the substrate 760 may be bonded through the permanent bonding layer 750. Therefore, during the fabrication process of the fingerprint identification module, the formation of the piezoelectric transducers 800 may be completed independently. The step of forming a sacrificial layer filling the cavities is omitted. Accordingly, there is no need to perform the operation of sacrificial layer release, which is beneficial to simplify the process steps. Further, the occurrence of the formation of sacrificial layer residues in the cavities because the unclean removal of the sacrificial layer in the cavities may be avoided.

Moreover, because the steps of forming the sacrificial layer and releasing the sacrificial layer are not required, the problem of the substrate 760 being scrapped due to the sacrificial layer process may be avoided, and the scrap rate of the substrate 760 may be reduced.

In addition, the piezoelectric transducers 800 may cover the cavities 751. Thus, the cavities 751 may be at a sealed status. Accordingly, the acoustic performance improvement effect of the cavities 751 may be enhanced, and the accuracy of the fingerprint identification may be improved.

Thirdly, during the fabrication process of the fingerprint recognition module, the formation of the piezoelectric transducers 800 may be completed independently, which may be beneficial to improve the flexibility of the process for forming the piezoelectric transducers 800. Further, it may be beneficial to avoid the influence of the process of forming the piezoelectric transducers 800 on the substrate 760. Thus, the quality of the substrate 760 may be guaranteed. Further, it may also be beneficial to reduce the scrap rate of the substrate 760.

A signal processing circuit may be formed in the substrate 760, and the substrate 760 may be used to drive the piezoelectric transducers and process detection signals generated by the piezoelectric transducers during the use of the fingerprint recognition module.

In one embodiment, the substrate 760 may be formed based on a CMOS process.

For example, the substrate 760 may be a wafer-level substrate to allow the substrate 760 and the piezoelectric transducers 800 to be integrated in a wafer-level manner to improve manufacturing efficiency. In some embodiments, the substrate may also be a chip-level substrate.

In one embodiment, the signal processing circuit in the substrate 760 may have connection terminals 765. The connection terminals 765 may be used to realize electrical connections between the substrate 760 and other devices and/or piezoelectric transducers.

In one embodiment, the substrate 760 may exposes the connection terminals 765. The connection terminals 765 may be pads.

The bonding strength of the permanent bonding layer 750 may be relatively high. The permanent bonding layer 750 may be used to realize the permanent bonding of the piezoelectric transducers 800 and the substrate 760, and make the piezoelectric transducers 800 and the substrate 760 permanently bonded. Accordingly, the bonding strength of the substrate 760 may be guaranteed, and the reliability of the fingerprint identification module may be improved. For example, the fingerprint identification accuracy of the fingerprint identification module may be improved.

Further, cavities 751 may be formed in the permanent bonding layer 750, and the cavities 751 may be used to improve the acoustic performance of the piezoelectric transducers 800.

In one embodiment, the substrate 760 may be a wafer-level substrate, and there may correspondingly multiple cavities 751.

The shape and size of the cavities 751 may be determined according to the design parameters of the piezoelectric transducers 800.

In one embodiment, the permanent bonding layer 750 may be a dry film. The dry film may be a photosensitive bonding material. Thus, the cavities 751 may be formed by performing a photolithography process on the permanent bonding film. Through the photolithography process, it may be beneficial to improve the dimensional accuracy of the opening of the cavities 151 while reducing the influence on the bonding strength of the permanent bonding layer 750. Moreover, by adopting a photolithography process to achieve patterning, the bonding strength of the permanent bonding layer 150 may be guaranteed.

The piezoelectric transducers 800 may serve as identification units in the fingerprint identification module.

A piezoelectric transducer 800 may include a first electrode 720, a piezoelectric layer 730 located on the first electrode 720, and a second electrode 740 located on the piezoelectric layer 730.

In one embodiment, the substrate 760 is a wafer-level substrate, and the number of piezoelectric transducers 800 may be multiple. Correspondingly, the number of the first electrodes 720 may be multiple, and the number of the second electrodes 740 may be multiple. The second electrodes 740 may be disposed opposite to the first electrodes 720, and the second electrodes 740 may have a one-to-one correspondence with the cavities 751.

In other embodiments, when the substrate is a chip-level substrate, the number of the piezoelectric transducer may be correspondingly one.

In one embodiment, the first electrodes 720 and the second electrodes 740 may be alternately arranged. For example, any one end of the second electrode 740 may be located at one side of the first electrode 720 such that an interconnection structure electrically connected to the second electrode 740 may be formed in the piezoelectric layer 730 at the side of the first electrode 720. Further, when the interconnection structure electrically connected to the second electrode 740 is formed, there may be no need to etch the first electrode 720. Thus, the process difficulty of the electrical connection process may be reduced.

The first electrode 720 may be used as the top electrode of the piezoelectric transducer 800, i.e., the electrode farther away from the substrate 760 in the fingerprint identification module. The second electrode 740 may be used as the bottom electrode of the electrical transducer 800, i.e., the electrode adjacent to the substrate 760 in the fingerprint identification module.

The material of the first electrodes 720 and the second electrodes 740 may be conductive materials, such as metal, metal silicide, metal nitride, metal oxide, or conductive carbon, etc., for example, may be Mo, Al, Cu, Ag, Au, Ni, Co, TiAl, TiN, or TaN, etc. In one embodiment, the materials of the first electrodes 720 and the second electrodes 740 may be both Mo.

During the use of the fingerprint identification module, the inverse piezoelectric effect of the piezoelectric layer 730 may be used to generate the ultrasonic wave to realize the ultrasonic fingerprint identification.

The material of the piezoelectric layer 730 may be piezoelectric crystal, piezoelectric ceramic, or piezoelectric polymer. The piezoelectric crystal may be aluminum nitride, lead zirconate titanate, quartz crystal, lithium gallate, lithium germanate, titanium germanate, lithium niobate, or lithium tantalate, etc. The piezoelectric polymer may be polyvinylidene fluoride, vinylidene fluoride-trifluoroethylene copolymer, nylon-11, or vinylidene cyanide-vinyl acetate alternating copolymer, etc.

In one embodiment, the material of the piezoelectric layer 730 may be aluminum nitride.

In one embodiment, the fingerprint identification module may further include an isolation layer 710 located on the surface of the first electrodes 720.

In the forming process of the fingerprint identification module, the piezoelectric transducers 800 may be formed on a carrier substrate. The carrier substrate may be removed by performing a thinning process, and the isolation layer may serve as a stop layer of the thinning process.

In one embodiment, the isolation layer 710 may also be located on the surface of the piezoelectric layer 730. In some embodiments, the isolation layer may also be located only on the surface of the first electrodes.

In one embodiment, the material of the isolation layer 710 may be silicon oxide. Silicon oxide is a commonly used dielectric material in the semiconductor field, which is easy to form and realize patterning, and has a low process cost. Further, it can better stop during the process of thinning the carrier substrate.

In one embodiment, the fingerprint recognition module further include interconnect structures (not labeled) for electrically connecting the first electrodes 720, the second electrodes 740 and/or the corresponding connection terminals 765 of the signal processing circuit.

The interconnection structures may electrically connect the corresponding connection terminals 165 of the signal processing circuit with the first electrodes 720 and the second electrodes 740 such that the substrate 760 and the piezoelectric transducers 800 may be electrically connected. Accordingly, the fingerprint identification function of the fingerprint identification module may be achieved.

For example, the interconnect structures may include first conductive plugs 772 electrically connected to the first electrodes 720, second conductive plugs 771 electrically connected to second electrodes 740, and third conductive plugs 773 electrically connected to connection terminals 765.

The first conductive plugs 772 may be used to realize electrical connections between the first electrodes 720 and external circuits, and the second conductive plugs 771 may be used to realize electrical connections between the second electrodes 740 and external circuits. The third conductive plugs 773 may be used to realize electrical connections between the substrate 760 and external circuits.

The first conductive plugs 772, the second conductive plugs 771, and the third conductive plugs 773 may facilitate the electrical connections between the substrate 760 and the first electrodes 720 and the second electrodes 740.

In one embodiment, the first conductive plugs 772 may be located in the isolation layer 710 and electrically connected to the first electrodes 720; the second conductive plugs 771 may be located in the piezoelectric layer 730 and electrically connected to the second electrodes 740; and the third conductive plugs 773 may pass through the piezoelectric layer 730 and the permanent bonding layer 750 and may be electrically connected to the connection terminals 765.

In one embodiment, the isolation layer 710 may also be located on the surface of the piezoelectric layer 730 exposed by the interconnect structure. Therefore, the second conductive plugs 771 may pass through the isolation layer 710 and the piezoelectric layer 730; and the third conductive plugs 773 may pass through the isolation layer 710, the piezoelectric layer 730 and the permanent bonding layer 750.

Correspondingly, the isolation layer 710 may also be used to provide a process platform for the formation of the interconnect structures, and to achieve electrical isolations of the interconnect structures.

In one embodiment, the material of the first conductive plugs 772, the second conductive plugs 771 and the third conductive plugs 773 may be a conductive material, and the conductive material may include one or more of Cu, Au, Ag, and Al, etc.

In one embodiment, the type of the interconnect structures may be conductive plugs (contact, CT). Such structures may reduce the complexity of the process for forming the interconnect structures and facilitate the subsequent packaging process.

In other embodiments, the type of the interconnect structures may also include other types of structures, such as rewiring (RDL) structures, etc.

In one embodiment, the fingerprint recognition module may further include a passivation layer 780 on the isolation layer 710 exposed by the first conductive plugs 772, the second conductive plugs 771 and the third conductive plugs 773. The passivation layer 780 may expose the first conductive plugs 772, the second conductive plugs 771, and the third conductive plugs 773.

The passivation layer 780 may be used to protect the piezoelectric transducers 800, and may prevent external impurities (such as sodium ions), ion charges, and water vapor, etc., from affecting the piezoelectric transducers 800 to improve the performance and stability of the fingerprint identification module. Accordingly, the accuracy of the fingerprint identification of the fingerprint recognition module may be improved.

In addition, the passivation layer 780 may expose the first conductive plugs 772, the second conductive plugs 771, and the third conductive plugs 773. Thus, the subsequent packaging process may be facilitated.

The material of the passivation layer 780 may be silicon oxide, silicon nitride, silicon carbon nitride, silicon carbon oxynitride, silicon oxynitride, boron nitride, boron carbon nitride, low-k dielectric material, or polyimide, etc.

It should be noted that, in other embodiments, when the isolation layer is only located on the surface of the first electrodes, the passivation layer may be located on the isolation layer and the piezoelectric layer exposed by the first conductive plugs, the second conductive plugs, and the third conductive plugs.

The fingerprint identification module in the present disclosure may be formed by the method described in the foregoing embodiments, but may also be formed using other fabrication methods. For the specific description of the fingerprint identification module in the present disclosure, reference may be made to the corresponding description in the foregoing embodiments, and this embodiment will not be repeated here.

Correspondingly, an embodiment of the present disclosure also provides an electronic device. The electronic device may include the aforementioned fingerprint identification module.

By disposing the fingerprint identification module described in the present disclosure in the electronic device, the fingerprint identification may be achieved.

The electronic device may also be a personal computer, a smart phone, a personal digital assistant (PDA), a media player, a navigation device, a game console, a tablet computer, a wearable device, an anti-access control electronic system, an automobile keyless entry electronic system, or a car keyless start electronic system, etc.

From the foregoing analysis, it can be seen that during the fabrication process of the fingerprint identification module, there is no sacrificial layer remaining in the cavity of the piezoelectric transducer, the acoustic performance of the piezoelectric transducer may be improved, and the quality of the substrate may also be ensured. Therefore, the fingerprint identification accuracy of the fingerprint recognition module may be substantially high. Thus, the user experience may be improved.

For the specific description of the fingerprint identification module in this embodiment, reference may be made to the corresponding description in the foregoing embodiments, and this embodiment will not be repeated here.

Comparing with the prior art, the technical solution of the embodiments of the present disclosure may have the following advantages.

In the embodiment of the disclosure, after the piezoelectric transducers are formed on the carrier substrate, a permanent bonding layer with cavities may be used to bond the carrier substrate and the substrate, and the permanent bonding layer may be located between the piezoelectric transducers and the substrate. The piezoelectric transducers may cover the cavities; and the isolation layer with the cavities may be formed on the substrate by deposition and patterning, and the piezoelectric transducers may be formed on the isolation layer. Comparing with the approach that forming the insulation layer on the cavities and then forming the piezoelectric transductor on the insulation layer, the embodiments of the present disclosure may use the permanent bonding layer instead of the isolation layer, and form piezoelectric transducers on the carrier substrate. Therefore, in the fabrication process of the fingerprint identification module, there may be no need to form a sacrificial layer filled in the cavities. Accordingly, the subsequent sacrificial layer release operation is not required. Thus, the problem of sacrificial layer residues being formed in the cavities due to the unclean removal of the sacrificial layer may be avoided. Further, the piezoelectric transducers may cover the cavities to make the cavities in a sealed shape. Thus, the acoustic performance improvement effect of the cavities may be improved; and the accuracy of fingerprint identification may be improved.

Although the present disclosure is disclosed as above, the present disclosure is not limited to this. Any person skilled in the art may make various changes and modifications without departing from the spirit and scope of the present disclosure. Therefore, the protection scope of the present disclosure should be subject to the scope defined by the claims.

What is claimed is:

1. A fingerprint identification module, comprising:
a substrate;
a signal processing circuit formed in the substrate;
a permanent bonding layer bonded to the substrate, the permanent bonding layer containing one or more cavities;
one or more piezoelectric transducers, located over the permanent bonding layer, wherein
a piezoelectric transducer of the one or more piezoelectric transducers includes a first electrode, a second electrode under the first electrode, and a piezoelectric layer between the first electrode and the second electrode,
the second electrode of each piezoelectric transducer fully covers one cavity, and
a second conductive plug electrically connected to the second electrode and formed on a side of the second electrode opposite to the cavity, the second conductive plug passing through the piezoelectric layer.

2. The fingerprint identification module according to claim 1, further comprising:
connection terminals of the signal processing circuit formed in the substrate and exposed by a surface of the substrate, and
third conductive plugs electrically connected to the connection terminals, wherein the third conductive plugs are formed through the permanent bonding layer and the piezoelectric layer.

3. The fingerprint identification module according to claim 1, further comprising:
an isolation layer, located on a surface of the first electrode.

4. The fingerprint identification module according to claim 3, further comprising:
a first conductive plug electrically connected to and formed on the first electrode, the first conductive plug further passing through the isolation layer.

5. The fingerprint identification module according to claim 1, wherein:
the permanent bonding layer includes a dry film.

6. The fingerprint identification module according to claim 1, wherein:
the substrate is a wafer-level substrate or a chip-level substrate.

7. The fingerprint identification module according to claim 1, further comprising:
the second electrode has a top surface coplanar with the permanent bonding layer, and
the first electrode has a top surface coplanar with the piezoelectric layer or above the piezoelectric layer.

8. The fingerprint identification module according to claim 1, further comprising:
an isolation layer formed on the first electrode, and
a passivation layer formed on the piezoelectric layer and on sidewalls of the isolation layer and the first electrode,
wherein the second conductive plug passing through the piezoelectric layer further includes a portion formed on the piezoelectric layer and on a sidewall of the passivation layer.

9. An electronic device, comprising:
a fingerprint identification module, comprising:
a substrate;
a signal processing circuit formed in the substrate;
a permanent bonding layer bonded to the substrate, the permanent bonding layer containing one or more cavities;
one or more piezoelectric transducers, located over the permanent bonding layer, wherein
a piezoelectric transducer of the one or more piezoelectric transducers includes a first electrode, a second electrode under the first electrode, and a piezoelectric layer between the first electrode and the second electrode,
the second electrode of each piezoelectric transducer fully covers one cavity, and
a second conductive plug electrically connected to the second electrode and formed on a side of the second electrode opposite to the cavity, the second conductive plug passing through the piezoelectric layer.

* * * * *